United States Patent
Kim et al.

(10) Patent No.: US 10,366,023 B2
(45) Date of Patent: Jul. 30, 2019

(54) OPERATION METHODS OF NONVOLATILE MEMORY DEVICES AND OPERATION METHODS OF MEMORY CONTROLLERS

(71) Applicant: Samsung Electronics Co., Ltd., Suwon-si, Gyeonggi-do (KR)

(72) Inventors: YoungWook Kim, Hwaseong-si (KR); Hyung-jin Kim, Seoul (KR); Soong-Man Shin, Hwaseong-si (KR); Keun-Hwan Lee, Anyang-si (KR)

(*) Notice: Subject to any disclaimer, the term of this patent is extended or adjusted under 35 U.S.C. 154(b) by 0 days.

(21) Appl. No.: 15/964,993

(22) Filed: Apr. 27, 2018

(65) Prior Publication Data
US 2019/0079882 A1    Mar. 14, 2019

(30) Foreign Application Priority Data

Sep. 11, 2017  (KR) .................. 10-2017-0116113

(51) Int. Cl.
| | |
|---|---|
| G11C 7/00 | (2006.01) |
| G06F 13/16 | (2006.01) |
| G11C 7/10 | (2006.01) |
| G11C 7/22 | (2006.01) |
| G06F 3/06 | (2006.01) |

(52) U.S. Cl.
CPC ........ *G06F 13/1689* (2013.01); *G06F 3/0614* (2013.01); *G06F 3/0658* (2013.01); *G06F 3/0673* (2013.01); *G11C 7/1009* (2013.01); *G11C 7/22* (2013.01); *G11C 2207/2254* (2013.01)

(58) Field of Classification Search
CPC .... G11C 7/1078; G11C 7/1009; G11C 7/1072
See application file for complete search history.

(56) References Cited

U.S. PATENT DOCUMENTS

| | | | | |
|---|---|---|---|---|
| 4,443,845 A | * | 4/1984 | Hamilton | ............. G06F 1/00 710/300 |
| 4,503,494 A | * | 3/1985 | Hamilton | ............. G06F 1/00 365/229 |
| 6,128,231 A | * | 10/2000 | Chung | ............. G11C 16/12 365/185.18 |

(Continued)

FOREIGN PATENT DOCUMENTS

| | | |
|---|---|---|
| KR | 2009-0070555 A | 7/2009 |
| KR | 2012-0011491 A | 2/2012 |
| KR | 2016-0101219 A | 8/2016 |

*Primary Examiner* — Tuan T Nguyen
(74) *Attorney, Agent, or Firm* — Harness, Dickey & Pierce, P.L.C.

(57) ABSTRACT

An operation method performed at a nonvolatile memory device may include receiving a program command and an address from an external device through a data signal (DQ), receiving a specific pattern from the external device through the data signal and a data strobe signal (DQS) synchronized with the data signal in a pattern period, receiving user data from the external device through the data signal and the data strobe signal in a data period, and selectively performing a program operation on the user data or a recovery operation based on a determination of whether the specific pattern matches with a particular pattern. A rising edge or a falling edge of the data strobe signal may be aligned with a left edge or a right edge of a window of the data signal in the pattern period.

20 Claims, 29 Drawing Sheets

(56) References Cited

U.S. PATENT DOCUMENTS

| | | |
|---|---|---|
| 7,692,980 B2 | 4/2010 | Seo |
| 8,565,033 B1 | 10/2013 | Manohararajah et al. |
| 8,832,509 B2 | 9/2014 | Yoon |
| 8,856,579 B2 | 10/2014 | Gower et al. |
| 8,902,683 B2 | 12/2014 | Jenkins et al. |
| 9,042,188 B2 | 5/2015 | Prakash et al. |
| 9,355,051 B2 | 5/2016 | Zitlaw |
| 9,431,091 B2 | 8/2016 | Gopalan et al. |
| 2004/0264252 A1* | 12/2004 | Morikawa .......... G11C 16/0475 365/185.28 |
| 2015/0117104 A1* | 4/2015 | Senoo ................. G11C 7/1039 365/185.12 |
| 2016/0239220 A1 | 8/2016 | Yu et al. |
| 2018/0059944 A1* | 3/2018 | Helmick ............... G06F 3/0604 |

\* cited by examiner

[Pattern Mismatching due to DQS delay]

[Pattern Mismatching due to DQS distortion]

[Pattern Mismatching due to DQS distortion]

OPERATION METHODS OF NONVOLATILE MEMORY DEVICES AND OPERATION METHODS OF MEMORY CONTROLLERS

CROSS-REFERENCE TO RELATED APPLICATIONS

A claim for priority under 35 U.S.C. § 119 is made to Korean Patent Application No. 10-2017-0116113 filed on Sep. 11, 2017, in the Korean Intellectual Property Office, the entire contents of which are hereby incorporated by reference.

BACKGROUND

Example embodiments of the inventive concepts described herein relate to semiconductor memories, and more particularly, relate to operation methods of nonvolatile semiconductor memories and operation method of memory controllers.

Semiconductor memory devices are classified into volatile memory devices, which lose data stored therein at power-off, including a static random access memory (SRAM), a dynamic RAM (DRAM), and a synchronous DRAM (SDRAM), and nonvolatile memory devices, which retain data stored therein even at power-off, including a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

Nonvolatile memory devices, including flash memory devices, are being widely used as storage media in computing systems. A nonvolatile memory device may be configured to communicate with a memory controller based on various electric signals. In some cases, when said electric signals are distorted due to various factors occurring during an operation of a nonvolatile memory device, the nonvolatile memory device may fail to transmit and receive data normally. Thus, functionality of the nonvolatile memory device may be sub-optimal.

SUMMARY

Example embodiments of the inventive concepts provide operation methods of nonvolatile memory devices and operation methods of memory controllers, where said operation methods may be implemented to improve reliability of said nonvolatile memory devices and/or memory controllers.

According to some example embodiments, an operation method of a nonvolatile memory device may include receiving a program command and an address at the nonvolatile memory device from an external device through a data signal (DQ), receiving a specific pattern at the nonvolatile memory device from the external device through the data signal and a data strobe signal (DQS) synchronized with the data signal in a pattern period, wherein a rising edge or a falling edge of the data strobe signal is aligned with a left edge or a right edge of a window of the data signal in the pattern period, receiving user data at the nonvolatile memory device from the external device through the data signal and the data strobe signal in a data period, and selectively performing a program operation on the user data or a recovery operation at the nonvolatile memory device based on a determination of whether the specific pattern matches with a particular pattern.

According to some example embodiments, an operation method of a nonvolatile memory device may include receiving a program command and an address at the nonvolatile memory device from an external device through a data signal (DQ), receiving a specific pattern at the nonvolatile memory device from the external device through the data signal and a data strobe signal (DQS) synchronized with the data signal in a pattern period, receiving user data and a cyclic redundancy check (CRC) code at the nonvolatile memory device from the external device through the data signal and the data strobe signal in a data period, and selectively performing a program operation on the user data or a recovery operation at the nonvolatile memory device based on a determination of whether the specific pattern does not match with a particular pattern and an error is detected from the user data based on the CRC code.

According to some example embodiments, an operation method of a memory controller to control a nonvolatile memory device may include transmitting a command and an address from the memory controller to the nonvolatile memory device through a data signal, transmitting a specific pattern from the memory controller to the nonvolatile memory device through the data signal and a data strobe signal synchronized with the data signal in a pattern period, wherein a rising edge or a falling edge of the data strobe signal is aligned with a left edge or a right edge of a window of the data signal in the pattern period, transmitting user data from the memory controller to the nonvolatile memory device through the data signal and the data strobe signal in a data period, receiving status information at the memory controller from the nonvolatile memory device, and performing a recovery operation on the nonvolatile memory device in response to the status information.

According to some example embodiments, a nonvolatile memory device may include a memory cell array including a plurality of memory cells, an input/output device configured to receive a specific pattern and user data from an external device through a data signal and a data strobe signal, a pattern checker configured to determine whether the specific pattern matches with a particular pattern and generate a determination result of the determining, and a control logic circuit configured to selectively perform a program operation to program the user data in the memory cell array or process the program operation as program failure without the program operation based on a determination result.

According to some example embodiments, an operation method of a nonvolatile memory device may include receiving a command and an address at the nonvolatile memory device from an external device, receiving a specific pattern and user data at the nonvolatile memory device from the external device through a data signal and a data strobe signal, and performing a re-training operation without a program operation associated with the user data at the nonvolatile memory device based on a determination that the received specific pattern does not match with a particular pattern.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, example embodiments of the inventive concepts may be described in detail and clearly to such an extent that an ordinary one in the art easily implements the inventive concepts.

Figure 1:
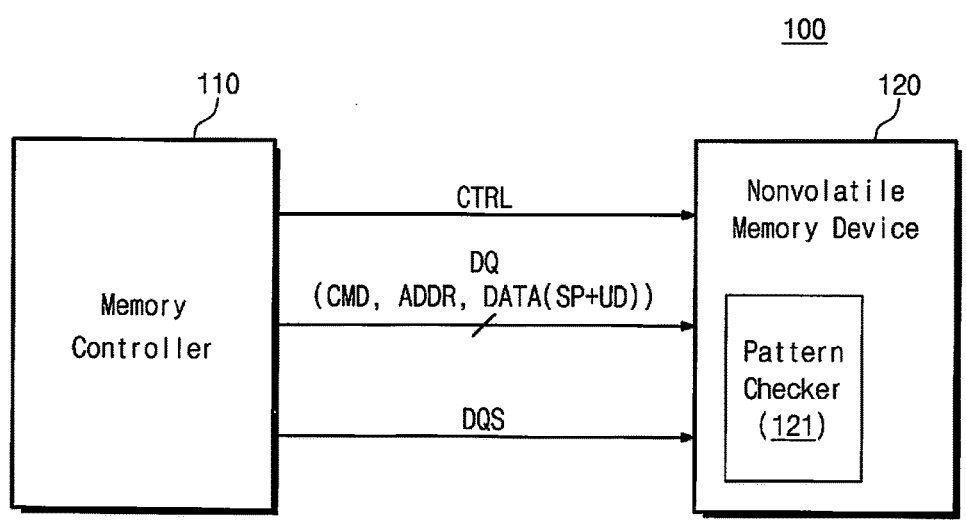
FIG. 1 is a block diagram illustrating a storage device according to some example embodiments of the inventive concepts.

FIG. 1 is a block diagram illustrating a storage device according to some example embodiments of the inventive concepts. Referring to FIG. 1, a storage device 100 may include a memory controller 110 and a nonvolatile memory device 120. In some example embodiments, the memory controller 110 may include a processor (e.g., instance of processing circuitry) and a memory. The memory of the memory controller 110 may store one or more programs of instructions, and the processor of the memory controller 110 may be configured to execute the one or more programs of instructions to implement the functionality of the memory controller 110 as described herein with regard to any of the example embodiments of memory controllers.

The memory controller 110 may store data in the nonvolatile memory device 120. For example, the memory controller 110 may provide a command CMD, an address ADDR, and data to the nonvolatile memory device 120 through a plurality of data signals DQ. The memory controller 110 may provide a control signal CTRL and a data strobe signal DQS to the nonvolatile memory device 120.

In some example embodiments, the control signal CTRL, the data strobe signal DQS, and a plurality of data signals DQ may be provided to the nonvolatile memory device 120 through different signal lines and different signal pins. The control signal CTRL and the data strobe signal DQS may be signals for distinguishing signals (e.g., the command CMD, the address ADDR, and data) provided to the nonvolatile memory device 120 through the plurality of data signals DQ. In some example embodiments, the data signal DQ represents a signal transmitted and received through the data pin (DQ pin), and the data strobe signal DQS represents a signal transmitted and received through a data strobe pin (DQS pin).

The nonvolatile memory device 120 may operate in response to signals received from the memory controller 110. For example, the nonvolatile memory device 120 may determine whether signals provided through the data signals DQ are the command CMD, the address ADDR, or data, based on the control signals CTRL. In some example embodiments, the control signal CTRL may include a chip enable signal, a command latch enable signal, an address latch enable signal, a read enable signal, or a write enable signal.

The nonvolatile memory device 120 may be configured to identify (or capture) data provided through the data signals DQ, based on the data strobe signal DQS. The nonvolatile memory device 120 may store the identified data based on the received command CMD and the received address ADDR.

Below, for convenience of description, it is assumed that data received in the nonvolatile memory device 120 is data identified based on the data strobe signal DQS. This expression is for making the description of the inventive concepts easy, not limiting the scope and spirit of the inventive concepts.

In some example embodiments, the nonvolatile memory device 120 may include a NAND flash memory. However, the inventive concepts may not be limited thereto. For example, the nonvolatile memory device 120 may include at least one of a volatile memory, such as a static RAM (SRAM), a DRAM, or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

The nonvolatile memory device 120 according to the inventive concepts may include a pattern checker 121. In some example embodiments, the pattern checker 121 may be implemented in the form of software, hardware, or a combination thereof. The pattern checker 121 may perform pattern checking (or pattern matching) on a part of data received from the memory controller 110 to determine validity for the rest of the received data.

In more detail, in a write operation or a program operation of the storage device 100, the memory controller 110 may provide the nonvolatile memory device 120 with data with a specific pattern (for convenience of description, hereinafter referred to as a "specific pattern (SP)") and user data UD through the data strobe signal DQS and the plurality of data signals DQ. The nonvolatile memory device 120 may identify the specific pattern SP and the user data UD from the memory controller 110, based on the data strobe signal DQS. For example, the nonvolatile memory device 120 may distinguish the plurality of data signals DQ at a rising edge or a falling edge of the data strobe signal DQS, to receive the specific pattern SP and the user data UD.

If the data strobe signal DQS or the data signal DQ is distorted due to various external factors (e.g., changes in temperature, operating voltage, and operating speed), the nonvolatile memory device 120 may fail to identify the specific pattern SP and the user data UD normally. In this case, since the user data UD is not identified normally, the nonvolatile memory device 120 may store unintended data or abnormal data.

The pattern checker 121 of the nonvolatile memory device 120 according to the inventive concepts may perform a pattern check operation for determining whether the specific pattern SP received from the memory controller 110 matches with a particular (or, alternatively, predefined) pattern and may process the user data UD as valid data or invalid data depending on the pattern check result, thereby preventing abnormal data from being stored therein and thus improving functionality of the nonvolatile memory device 120.

For example, in the case where the received specific pattern SP matches with the particular (or, alternatively, predefined) pattern, the nonvolatile memory device 120 may perform a program operation on the user data UD. In the case where the received specific pattern SP does not match with the particular (or, alternatively, predefined) pattern, the memory controller 110 and the nonvolatile memory device 120 may perform a recovery operation such that center aligning between the data strobe signal DQS and the data signal DQ is made or distortion of the data strobe signal DQS or the data signal DQ is corrected. An operation of the nonvolatile memory device 120 according to the inventive concepts will be described with reference to accompanying drawings.

Figure 2:
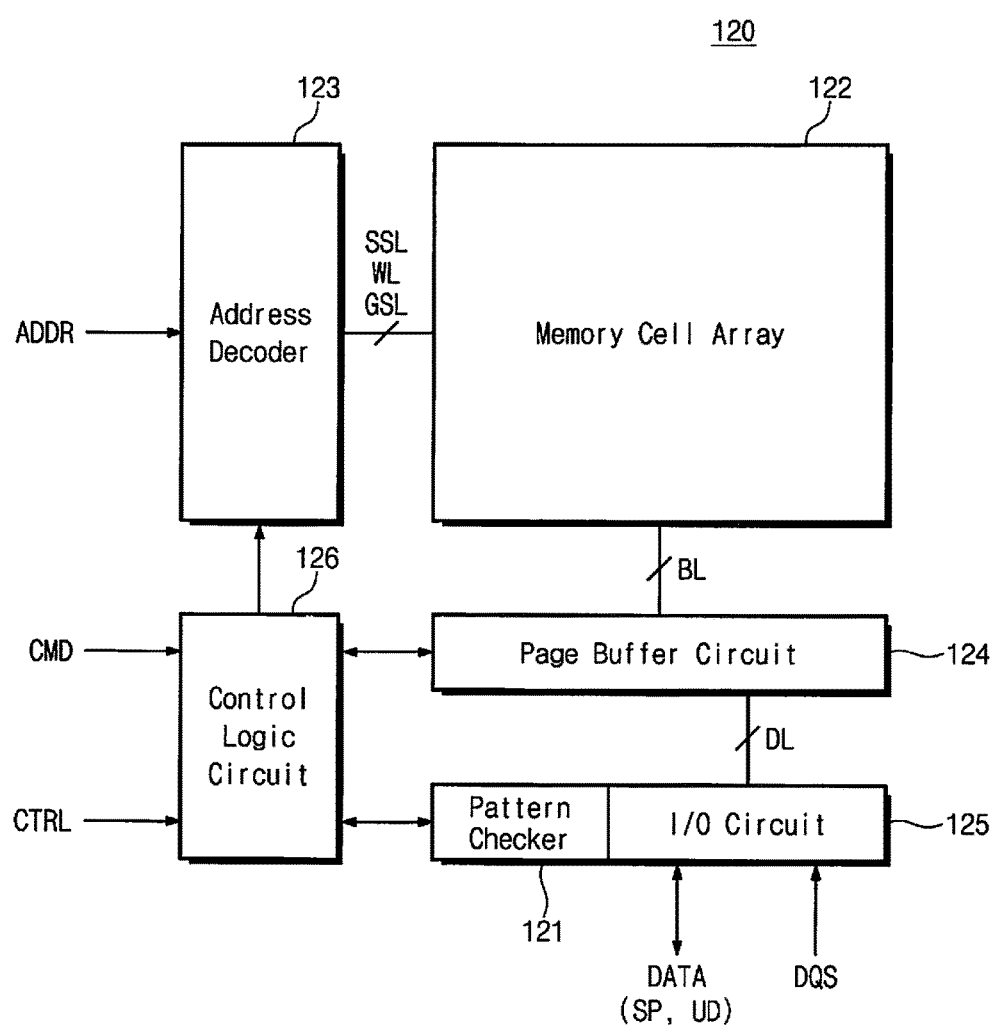
FIG. 2 is a block diagram illustrating a nonvolatile memory device of FIG. 1.

FIG. 2 is a block diagram illustrating a nonvolatile memory device of FIG. 1. Referring to FIG. 2, the nonvolatile memory device 120 may include the pattern checker 121, a memory cell array 122, an address decoder 123, a page buffer circuit 124, an input/output circuit 125, and a control logic circuit 126. One or more of the aforementioned elements of the nonvolatile memory device 120 (e.g., the pattern checker 121, the address decoder 123, the page buffer circuit 124, the input/output circuit 125, and/or the control logic circuit 126) may be implemented by a processor and a memory that are included in the nonvolatile memory device 120, where the processor executes a program of instructions stored on the memory to implement the functionality of the one or more aforementioned elements. In some example embodiments, one or more of the aforementioned elements of the nonvolatile memory device 120 (e.g., the pattern checker 121, the address decoder 123, the page buffer circuit 124, the input/output circuit 125, and/or the control logic circuit 126) may be an instance of electrical circuitry configured to implement the functionality of the one or more elements. The pattern checker 121 may perform a pattern check operation on the specific pattern SP received from the memory controller 110 as described above. The pattern check result may be provided to the control logic circuit 126.

The memory cell array 122 may include a plurality of memory blocks. Each of the memory blocks may include a plurality of memory cells. The memory cells may be connected with a plurality of word lines WL. Each memory cell may be a single level cell (SLC) storing 1-bit data or a multi-level cell (MLC) storing data of two or more bits.

The address decoder 123 may be connected with the memory cell array 122 through string selection lines SSL, the word lines WL, and ground selection lines GSL. The address decoder 123 may receive and decode an address ADDR from the memory controller 110. The address decoder 123 may control voltages of the string selection lines SSL, the word lines WL, and the ground selection lines GSL based on the decoded address.

The page buffer circuit 124 may be connected with the memory cell array 122 through bit lines BL. The page buffer circuit 124 may be connected with the input/output circuit 125 through signal lines DL. The page buffer circuit 124 may receive data (in particular, the user data UD) from the input/output circuit 125 through the signal lines DL and may temporarily store the received data. Alternatively, the page buffer circuit 124 may be used to temporarily store data read from the memory cell array 122.

The input/output circuit 125 may receive data from the memory controller 110. In some example embodiments, the input/output circuit 125 may be configured to identify or receive data in synchronization with the data strobe signal DQS from the memory controller 110. In some example embodiments, the data may include the specific pattern SP and the user data UD.

The control logic circuit 126 may control the address decoder 123, the page buffer circuit 124, the input/output circuit 125, and the pattern checker 121 in response to a command CMD and a control signal CTRL from the memory controller 110. In some example embodiments, the control logic circuit 126 may control each component based on the pattern check result of the pattern checker 121 such that a program operation is not performed on the user data UD received from the memory controller 110. Although not illustrated in FIG. 2, the pattern checker 121 may be included in the control logic circuit 126, the input/output circuit 125, or the page buffer circuit 124.

As described herein, the nonvolatile memory device 120 may include a memory cell array 122 including a plurality of memory cells, an input/output device (e.g., input/output circuit 125) configured to receive a specific pattern SP and user data UD from an external device (e.g., memory controller 110) through a data signal DQ and a data strobe signal DQS, a pattern checker 121 configured to determine whether the specific pattern SP matches with a particular (or, alternatively, predefined) pattern and generate a determination result of the determination, and a control logic circuit 126 configured to selectively perform a program operation to program the user data UD in the memory cell array 122 or process the program operation as program failure without the program operation based on a determination result.

The control logic circuit 126 may be configured to provide information associated with a program failure to the external device as status information based on a request of the external device.

The control logic circuit 126 may be configured to provide status information to the external device in response to a determination that a program confirm command is received at the nonvolatile memory device 120 from the external device.

The control logic circuit 126 may be configured to provide status information to the external device prior to a program confirm command being received at the nonvolatile memory device 120 from the external device.

Figure 3A:
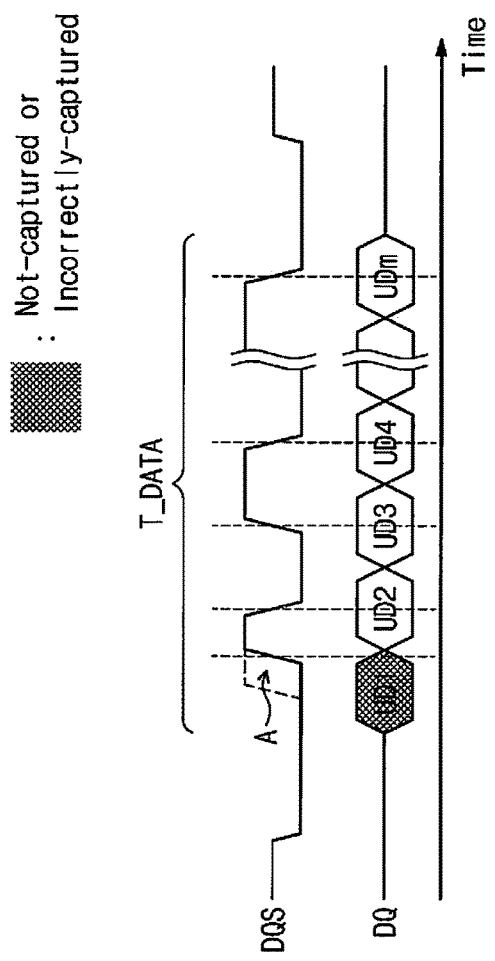
FIG. 3A, FIG. 3B, and FIG. 3C are timing diagrams illustrating a data signal and a data strobe signal input to the nonvolatile memory device.
Figure 3B:
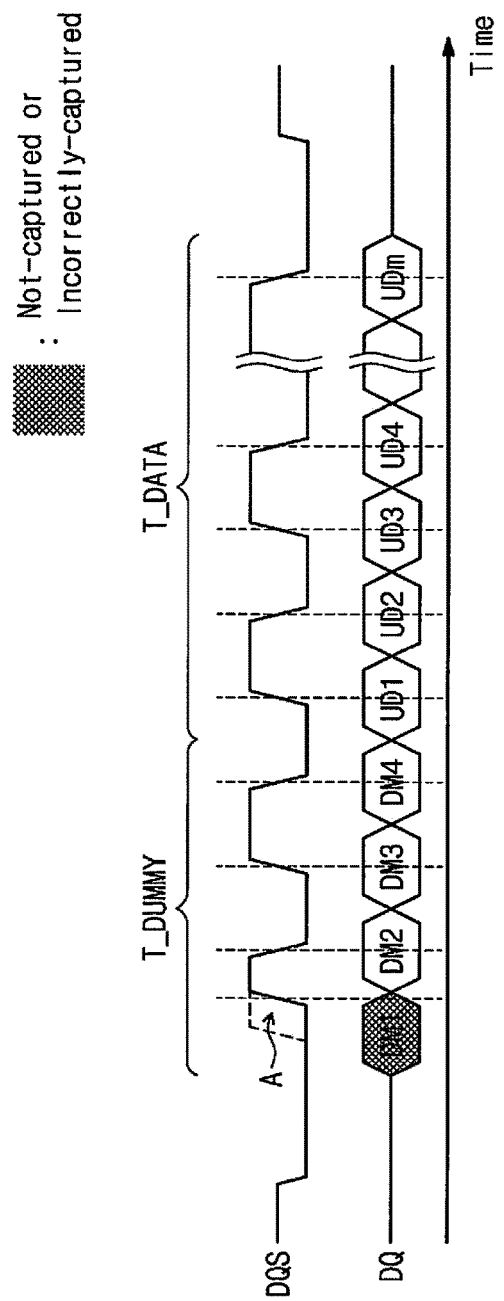
Figure 3C:
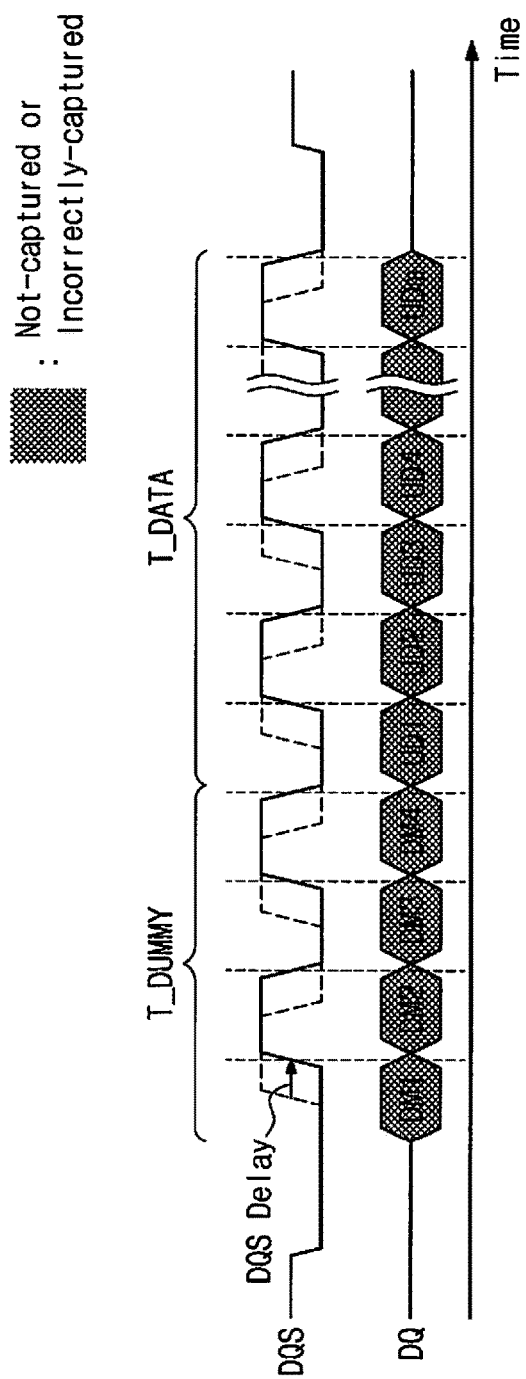

FIG. 3A, FIG. 3B, and FIG. 3C are timing diagrams illustrating a data signal and a data strobe signal input to a nonvolatile memory device. In some example embodiments, issues due to distortion of the data strobe signal DQS or the data line DQ will be described with reference to FIGS. 3A to 3C.

Also, for brevity of illustration and convenience of description, the control signal CTRL, the command CMD, and the address ADDR provided from the memory controller 110 in a program operation are omitted in FIGS. 3A to 3C, and the data strobe signal DQS and the data signal DQ input to the nonvolatile memory device 120 is only illustrated in FIGS. 3A to 3C.

Also, one data signal DQ is illustrated in FIGS. 3A to 3C, but the scope and spirit of the inventive concepts may not be limited thereto. For example, a variety of information may be provided to the nonvolatile memory device 120 through a plurality of data signals DQ.

First, referring to FIGS. 1 and 3A, the memory controller 110 may provide a plurality of user data UD1 to UDm to the nonvolatile memory device 120 through the data signal DQ. In this case, the memory controller 110 may provide the data strobe signal DQS synchronized with the data signal DQ to allow the nonvolatile memory device 120 to identify the plurality of user data UD1 to UDm. Below, for convenience of description, a period in which the user data UD are provided from the memory controller 110 to the nonvolatile memory device 120 is referred to as a "data period T_DATA".

The nonvolatile memory device 120 may identify (or capture or receive) the data signal DQ at a rising edge or a falling edge of the data strobe signal DQS. In an ideal case, the rising edge or the falling edge of the data strobe signal DQS is center-aligned with the center of a window range of the data signal DQ. However, as illustrated in an "A" region of FIG. 3A, a duty rate of a first cycle of the data strobe signal DQS may vary. In this case, as illustrated in FIG. 3A, the first user data UD1 may not be identified or may be incorrectly identified in the nonvolatile memory device 120. Thus, functionality of the nonvolatile memory device 120 may be degraded as a result of the variation of the duty rate of the first cycle of the data strobe signal DQS.

Referring to FIG. 3B, a dummy period T_DUMMY may be added before the data period T_DATA. For example, the memory controller 110 may transmit dummy data DM1 to DM4 to the nonvolatile memory device 120 in the dummy period T_DUMMY, and then the memory controller 110 transmits the user data UD1 to UDm to the nonvolatile memory device 120 in the data period T_DATA.

The nonvolatile memory device 120 may ignore the dummy data DM1 to DM4 received in the dummy period T_DUMMY and may recognize the user data UD1 to UDm received in the data period T_DATA following the dummy period T_DUMMY as effective data. Accordingly, even though the duty rate of the data strobe signal DQS varies in a given period (in particular, the first period or some periods of the data strobe signal DQS), the nonvolatile memory device 120 may distinguish the user data UD1 to UDm correctly.

In some example embodiments, the dummy period T_DUMMY of FIG. 3B may be a "DQS latency for WRITE", and the length of the dummy period T_DUMMY of FIG. 3B may correspond to two cycles of the data strobe signal DQS. The length of the dummy period T_DUMMY may correspond to a particular (or, alternatively, predefined) time period established by the memory controller 110 and the nonvolatile memory device 120 or the number of cycles predefined thereby. In some example embodiments, the length of the dummy period T_DUMMY may be set by a set feature operation between the memory controller 110 and the nonvolatile memory device 120.

Referring to FIG. 3C, as described with reference to FIG. 3B, after transmitting the dummy data DM1 to DM4 to the nonvolatile memory device 120 in the dummy period T_DUMMY, the memory controller 110 transmits the user data UD1 to UDm to the nonvolatile memory device 120 in the data period T_DATA. However, unlike FIG. 3B, the whole ("entire") data strobe signal DQS may be delayed due to various factors. In this case, the nonvolatile memory device 120 may fail to identify or may incorrectly identify the user data UD1 to UDm as well as the dummy data DM1 to DM4.

According to some example embodiments of the inventive concepts, in the case where distortion (e.g., a duty rate difference or delay occurrence) of the data strobe signal DQS is made due to various factors, the nonvolatile memory device 120 may detect the distortion of the data strobe signal DQS through the pattern check operation and may perform a recovery operation corresponding to the pattern check result. Accordingly, abnormal data may be prevented from being programmed, and the functionality of the nonvolatile memory device 120 may thus be improved based on the nonvolatile memory device being configured to correctly identify the user data US1 to USm despite distortion of the data strobe signal DQS.

Figure 4:
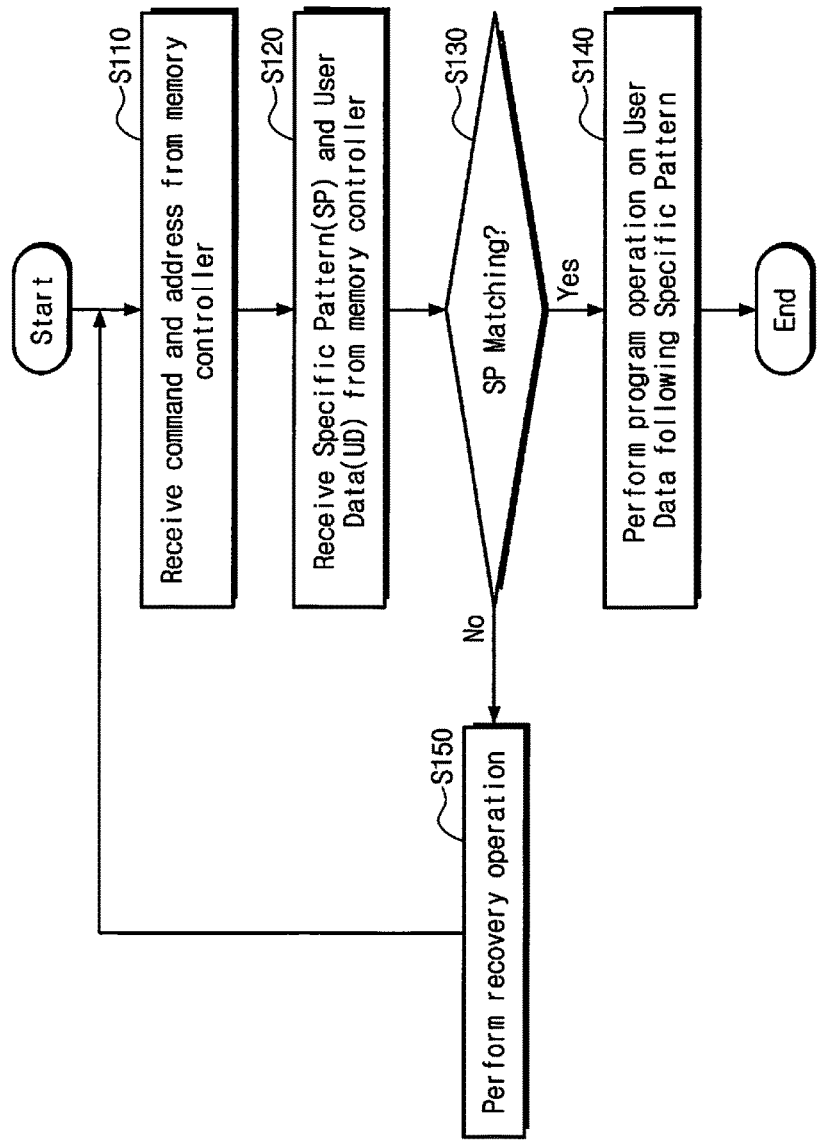
FIG. 4 is a flowchart illustrating an operation of the nonvolatile memory device of FIG. 1.

FIG. 4 is a flowchart illustrating an operation of a nonvolatile memory device of FIG. 1. Some or all of the operations illustrated to be performed in FIG. 4 may be performed at a nonvolatile memory device, including the nonvolatile memory device 120 as described herein. As described herein with regard to at least FIG. 4, the memory controller 110 may be replaced with an "external device." Referring to FIGS. 1 and 4, in operation S110, the nonvolatile memory device 120 may receive the command CMD (e.g., a "program command") and the address ADDR from the memory controller 110. For example, the nonvolatile memory device 120 may receive the command CMD and the address ADDR from the memory controller 110 through the data signal DQ as described above. As described herein, a first element (e.g., the nonvolatile memory device 120) receiving a signal from a second element (e.g., the memory controller 110) may be referred to as the signal being received "at the first element from the second element."

In some example embodiments, the memory controller 110 may provide the nonvolatile memory device 120 with the control signal CTRL for distinguishing the command CMD and the address ADDR. In some example embodiments, the command CMD may be one of various program commands, and the address ADDR may indicate a location of a region where the user data UD will be stored. Below, for a brief description, a period where operation S110 is performed is referred to as a "command/address period".

In operation S120, the nonvolatile memory device 120 may receive the specific pattern SP and the user data UD from the memory controller 110 through the data signals DQ and a data strobe signal (DQS) synchronized with the data signals DQ in a pattern period. For example, from the memory controller 110, the nonvolatile memory device 120 may receive the specific pattern SP during a pattern period and may receive the user data UD through the data signal DQ and the data strobe signal DQS during a data period (refer to FIGS. 3A to 3C). In some example embodiments, the pattern period may exist between the command/address period and the data period, and the data period may be subsequent to the pattern period.

In some example embodiments, the nonvolatile memory device 120 may be configured to identify the specific pattern SP and the user data UD received through the data signal DQ, based on the data strobe signal DQS received from the memory controller 110. Below, for convenience of description, the specific pattern SP identified on the basis of the data strobe signal DQS is referred to as a "received specific pattern SP". That is, the received specific pattern SP may be correctly identified or may be a different value, depending on whether the data strobe signal DQS or the data signal DQ is distorted.

In some example embodiments, the specific pattern SP may be a particular pattern that may be predefined between the memory controller 110 and the nonvolatile memory device 120. In some example embodiments, the specific pattern SP may be a pattern set through a specific operation between the memory controller 110 and the nonvolatile memory device 120. In some example embodiments, the specific pattern SP may be a pattern set in advance to an all-zero value or any value.

In operation S130, the nonvolatile memory device 120 may determine whether the specific pattern SP is matched with a particular (or, alternatively, predefined) pattern (or may perform a pattern check operation) and may selectively perform a program operation on the user data (S140) or a recovery operation (S150) based on a determination of whether the specific pattern matches with a particular pattern. For example, in the case where distortion is absent from the data strobe signal DQS from the memory controller 110, the specific pattern SP received during the pattern period may be correctly identified, and the identified specific pattern SP may match with the particular (or, alternatively, predefined) pattern. Such selectively performing the program operation on the user data (S140) or the recovery operation (S150) based on a determination of whether the specific pattern matches with a particular pattern may be referred to herein as selectively performing a recovery operation (S150) based on a determination of whether the specific pattern fails to match with a particular pattern (S130=NO).

In the case where the received specific pattern SP matches with the particular (or, alternatively, predefined) pattern (S130=YES), in operation S140, the nonvolatile memory device 120 may perform a program operation on the user data UD received in the data period following the pattern period.

In the case where the received specific pattern SP does not match with the particular (or, alternatively, predefined) pattern (S130=NO), in operation S150, the nonvolatile memory device 120 may perform a recovery operation. In some example embodiments, the recovery operation may include various operations for adjusting the data signal DQ and the data strobe signal DQS between the memory controller 110 and the nonvolatile memory device 120.

For example, the recovery operation may include at least one of an operation in which the nonvolatile memory device 120 processes the user data UD as invalid data; an operation in which the nonvolatile memory device 120 processes a program operation associated with the user data UD as program failure without performing the program operation; a re-training operation between the memory controller 110 and the nonvolatile memory device 120; a re-locking operation between the memory controller 110 and the nonvolatile memory device 120; a reset operation of the nonvolatile memory device 120; an operation of changing an operating frequency of the nonvolatile memory device 120; or, an operation of changing an operation voltage of the nonvolatile memory device 120. The above recovery operations are only exemplary, and the scope and spirit of the inventive concepts is not limited thereto. In some example embodiments, the distortion of the data signal DQ or the data strobe signal DQS may be corrected or calibrated by performing the recovery operation, thereby causing improvement to the functionality of the nonvolatile memory device 120 by enabling the nonvolatile memory device 120 to correctly identify and properly perform a program operation on the user data UD received in the data period following the pattern period, despite distortion of the data signal DQ or the data strobe signal DQS.

After performing the recovery operation, the nonvolatile memory device 120 may perform operation S110 to operation S130 such that a program operation is performed on the user data UD.

Figure 5A:
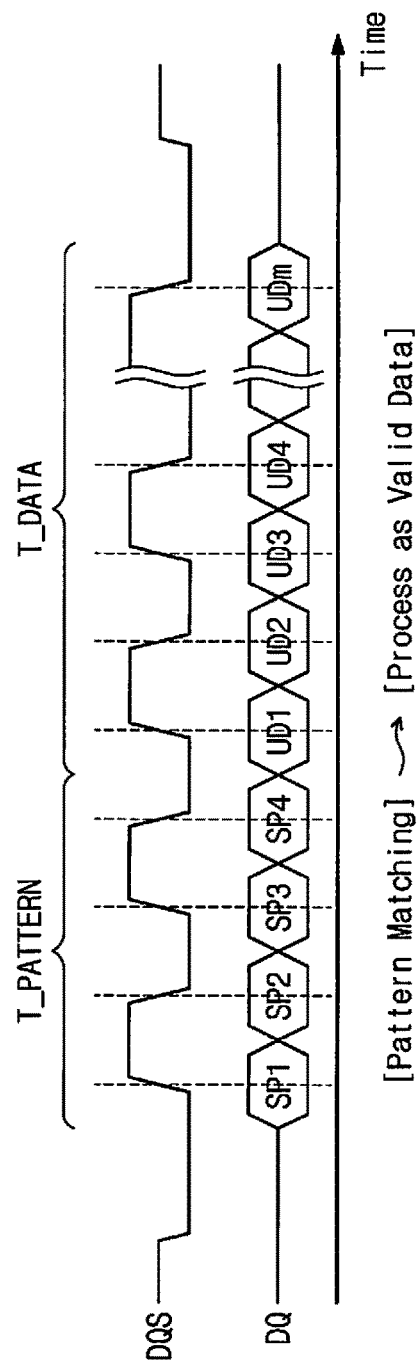
FIG. 5A and FIG. 5B are timing diagrams illustrating a data signal and a data strobe signal input to the nonvolatile memory device.
Figure 5B:
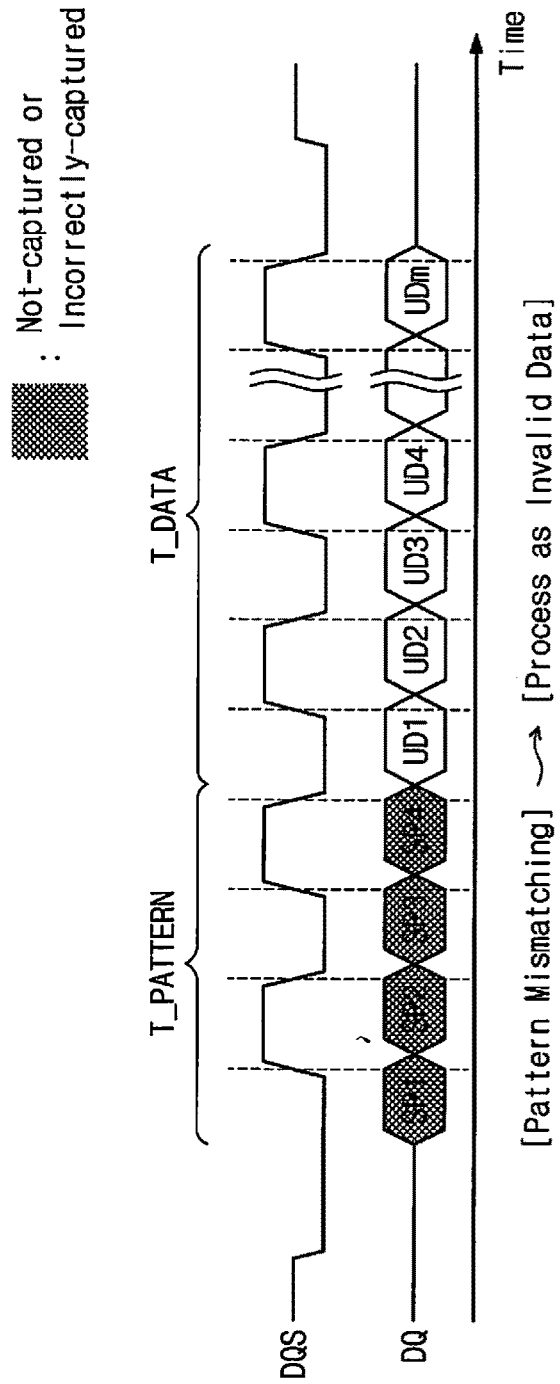

FIGS. 5A and 5B are timing diagrams illustrating an example of a data-in operation of a nonvolatile memory device of FIG. 1. In some example embodiments, in the timing diagrams of FIGS. 5A and 5B, a horizontal axis denotes a time. In some example embodiments, a data-in operation when the specific pattern SP matches with the particular (or, alternatively, predefined) pattern is described with reference to FIG. 5A, and a data-in operation when the specific pattern SP does not match with the particular (or, alternatively, predefined) pattern is described with reference to FIG. 5B. For brevity of illustration, inputs for a command (e.g., a program command) and an address are omitted in FIGS. 5A and 5B.

Also, for a brief description, it is assumed that the pattern period T_PATTERN corresponds to two cycles of the data strobe signal DQS. Restated, a length of the pattern period T_PATTERN may correspond to a particular period of the data strobe signal DQS. However, the scope and spirit of the inventive concepts are not limited thereto. For example, the pattern period T_PATTERN may be predefined to another value (e.g., 1, 3, or 4 cycles of DQS) between the memory controller 110 and the nonvolatile memory device 120. In some example embodiments, the pattern period T_PATTERN may be included in a "DQS latency for WRITE". In some example embodiments, the pattern period T_PATTERN may exist between the command/address period and the data period.

Referring to FIGS. 1, 5A, and 5B, the nonvolatile memory device 120 receives first to fourth specific patterns SP1 to SP4 from the memory controller 110 through the data signal DQ during the pattern period T_PATTERN. The nonvolatile memory device 120 may identify the first to fourth specific patterns SP1 to SP4 received through the data signals DQ, based on the data strobe signal DQS. As illustrated in FIG. 5A, in the case where the data strobe signal DQS is not distorted (in other words, in the case where a rising edge or a falling edge of the data strobe signal DQS is center-aligned with the data signal DQ), the nonvolatile memory device 120 may identify the first to fourth specific patterns SP1 to SP4 correctly.

In this case, the received first to fourth specific patterns SP1 to SP4 may match with a particular (or, alternatively, predefined) pattern. The nonvolatile memory device 120 processes a plurality of user data UD1 to UDm received in a next data period T_DATA as valid data depending on the pattern check result. That is, the nonvolatile memory device 120 may perform a program operation on the received user data UD1 to UDm.

In contrast, unlike the description given with reference to FIG. 5A, the data strobe signal DQS may be distorted due to various factors (e.g., changes in temperature, voltage, and operating speed) (e.g., the whole data strobe signal DQS is delayed). In this case, the first to fourth specific patterns SP1 to SP4 that the nonvolatile memory device 120 receives in the pattern period T_PATTERN may not be correctly identified. That is, the received first to fourth specific patterns SP1 to SP4 may not match with the particular (or, alternatively, predefined) pattern. In this case, the nonvolatile memory device 120 may process the plurality of user data UD1 to UDm received in the next data period T_DATA as invalid data. That is, the nonvolatile memory device 120 may perform a recovery operation without performing a program operation on the received user data UD1 to UDm.

As described above, before receiving the plurality of user data UD1 to UDm from the memory controller 110, the nonvolatile memory device 120 may receive the specific pattern SP and may perform a pattern check operation on the received specific pattern SP. Depending on the pattern check result, the nonvolatile memory device 120 may perform or may not perform a program operation on the received user data UD1 to UDm. In some example embodiments, in the case where the received specific pattern SP does not match with the particular (or, alternatively, predefined) pattern, the nonvolatile memory device 120 may perform the recovery operation without performing a program operation on the received user data UD1 to UDm, thereby preventing incorrect user data (or abnormal user data) from being programmed. This means that the reliability of data is secured, and thus the functionality of the nonvolatile memory device 120 in properly identifying and processing user data may be improved to account for distortion of the data signal DQ or the data strobe signal DQS.

Figure 6:
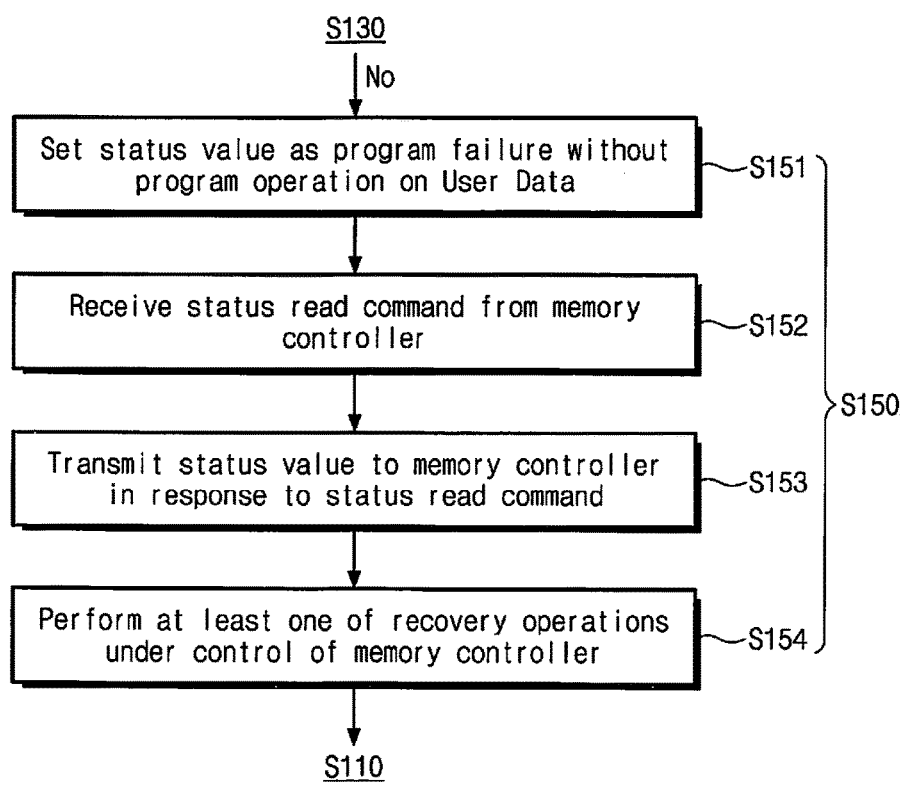
FIG. 6 is a flowchart illustrating operation S150 of FIG. 4 in detail.

FIG. 6 is a flowchart illustrating operation S150 of FIG. 4 in detail. A recovery operation corresponding to operation S150 will be more fully described with reference to FIG. 6. However, the flowchart of FIG. 6 is to describe the technical idea of the inventive concepts easily, and the scope and spirit of the inventive concepts is not limited thereto.

Referring to FIGS. 1, 4, and 6, if the determination result of operation S130 indicates that the specific pattern SP does not match with the particular (or, alternatively, predefined) pattern (e.g., based on the determination result indicating that the specific pattern SP does not match with the particular (or, alternatively, predefined) pattern), the nonvolatile memory device 120 may perform the recovery operation in operation S150. In some example embodiments, operation S150 may include operation S151 to operation S154, as shown in FIG. 6. As described herein, operation S150, and thus operations S151 to S154 may include processing a program operation as program failure without the program operation on the user data at the nonvolatile memory device 120 based on a determination that the specific pattern SP does not match with the particular (or, alternatively, predefined) pattern.

For example, in operation S151, the nonvolatile memory device 120 may set a status register as program failure without a program operation on the received user data UD. In some example embodiments, the status register may be a storage circuit included in the nonvolatile memory device 120 for the purpose of storing information about an operation status of the nonvolatile memory device 120. In some example embodiments, a value of the status register may be provided to the memory controller 110 through the data signal DQ or a separate signal by a request (in particular, a status read command) of the memory controller 110.

In operation S152, the nonvolatile memory device 120 may receive the status read command from the memory controller 110. In some example embodiments, the status read command may be a command for reading a value of the status register of the nonvolatile memory device 120.

In operation S153, the nonvolatile memory device 120 may transmit the value stored in the status register to the memory controller 110 in response to the received status read command. In some example embodiments, the nonvolatile memory device 120 may transmit status information about ("associated with") "program failure" stored in the status register in operation S151 to the memory controller 110. Restated, the nonvolatile memory device 120 may provide information associated with the program failure from the nonvolatile memory device 120 to an external device (e.g., memory controller 110) as status information based on a request of the external device. In some example embodiments, the status information about "program failure" stored in the status register may include information about ("associated with") pattern mismatch (i.e., information representing that the specific pattern SP does not match with the particular (or, alternatively, predefined) pattern). In some example embodiments, the status information may be transmitted from the nonvolatile memory device 120 to the memory controller 110 through the data signal DQ.

In operation S154, the nonvolatile memory device 120 may perform at least one of various recovery operations under control of the memory controller 110. For example, the memory controller 110 may recognize that the nonvolatile memory device 120 fails to receive the user data UD normally due to the distortion of the data strobe signal DQS or the data signal DQ, based on the status information from the nonvolatile memory device 120. The memory controller 110 may perform a re-training operation with the nonvolatile memory device 120 based on the recognition result. Alternatively, the memory controller 110 may perform a re-locking operation with the nonvolatile memory device 120 based on the recognition result. In some example embodiments, the re-training operation may be performed at a high speed of 800 Mbps or higher, and the re-locking operation may be performed at a low speed of 800 Mbps or lower. Alternatively, the memory controller 110 may change an operating speed (or a frequency of the data strobe signal DQS or the data signal DQ) of the nonvolatile memory device 120. Alternatively, the memory controller 110 may change an operating voltage of the nonvolatile memory device 120. Alternatively, the memory controller 110 may perform a reset operation on the nonvolatile memory device 120. Afterwards, the nonvolatile memory device 120 may return to operation S110.

Figure 7A:
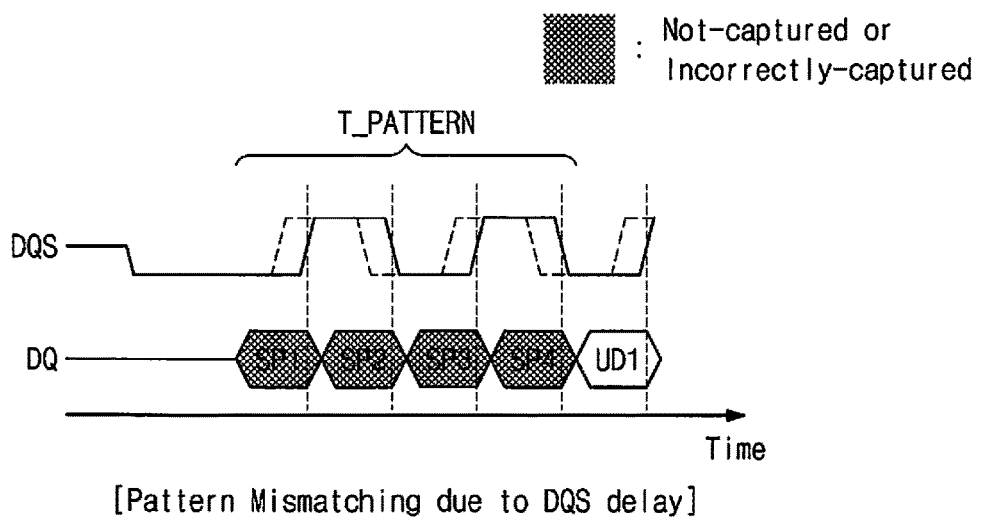
FIG. 7A, FIG. 7B, and FIG. 7C are timing diagrams illustrating exemplary cases of pattern mismatch.
Figure 7B:
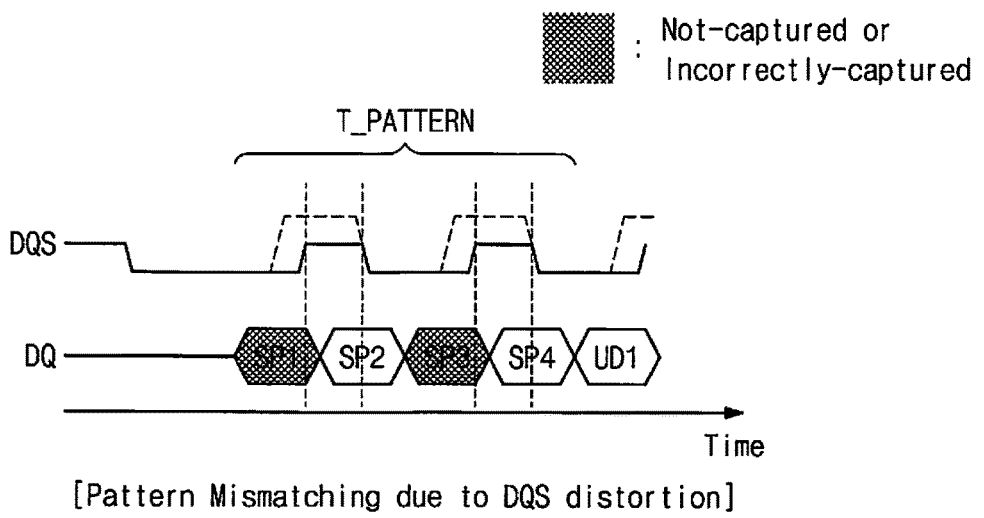
Figure 7C:
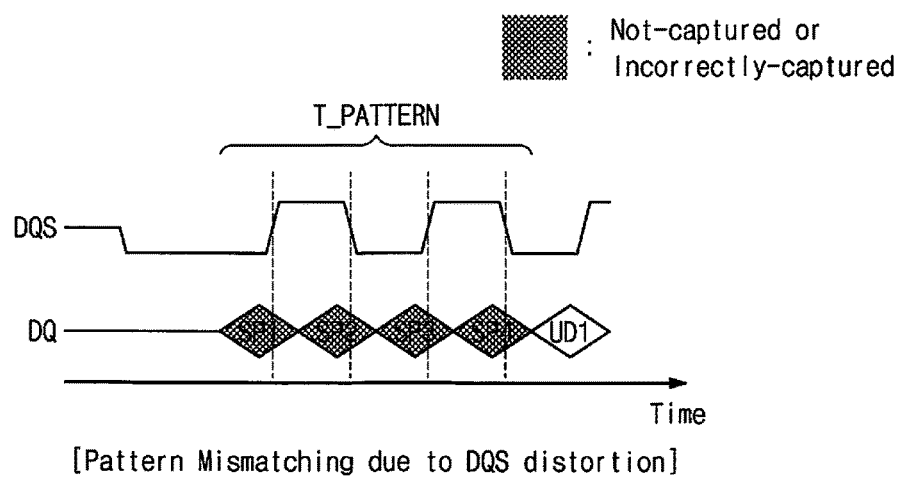

FIGS. 7A to 7C are timing diagrams illustrating exemplary cases of pattern mismatch. In the timing diagrams of FIGS. 7A to 7C, a horizontal axis represents a time. In some example embodiments, pattern mismatch cases will be described with reference to the timing diagrams of FIGS. 7A to 7C. However, the scope and spirit of the inventive concepts are not limited thereto. For example, since various different pattern mismatch cases exist, the scope and spirit of the inventive concepts may be variously changed or modified.

Referring to FIGS. 1 and 7A to 7C, the nonvolatile memory device 120 may receive the first to fourth specific patterns SP1 to SP4 through the data strobe signal DQS and the data signals DQ during the pattern period T_PATTERN.

As illustrated in FIG. 7A, in the case where the data strobe signal DQS is distorted due to various factors (e.g., changes in temperature, voltage, and operating speed) (e.g., in the case where a DQS delay occurs), the data strobe signal DQS may not be center-aligned with the data signal DQ. In this case, as described above, the nonvolatile memory device 120 may fail to receive the first to fourth specific patterns SP1 to SP4 normally. That is, due to the delay of the data strobe signal DQS, the first to fourth specific patterns SP1 to SP4 received by the nonvolatile memory device 120 may not match with a particular (or, alternatively, predefined) pattern.

As illustrated in FIG. 7B, the data strobe signal DQS may fail to fully swing due to various factors (e.g., changes in temperature, voltage, and operating speed). In this case, as illustrated in FIG. 7B, only some (e.g., the second and fourth specific patterns SP2 and SP4) of the first to fourth specific patterns SP1 to SP4 may be normally received. That is, since the data strobe signal DQS does not fully swing, some of the first to fourth specific patterns SP1 to SP4 received by the nonvolatile memory device 120 may not match with the particular (or, alternatively, predefined) pattern.

As illustrated in FIG. 7C, the data signal DQ may be distorted due to various factors (e.g., changes in temperature, voltage, and operating speed). Since a signal integrity margin for the data signal DQ is not sufficiently secured due to the distortion of the data signal DQ, the nonvolatile memory device 120 may fail to receive the first to fourth specific patterns SP1 to SP4 normally. That is, due to the distortion of the data signal DQ, all the first to fourth specific patterns SP1 to SP4 received by the nonvolatile memory device 120 may not match with the particular (or, alternatively, predefined) pattern.

As described above, the nonvolatile memory device 120 may fail to receive specific patterns normally due to various distortions of the data strobe signal DQS or the data signal DQ. The nonvolatile memory device 120 according to the inventive concepts may perform one of various recovery operations based on the pattern check result of the specific pattern.

For example, the event that only some of specific patterns match with the particular (or, alternatively, predefined) pattern may occur when a full swing of the data strobe signal DQS is not performed. In this case, the memory controller 110 and the nonvolatile memory device 120 may decrease an operating frequency of the data signal DQ and the data strobe signal DQS such that the data strobe signal DQS fully swings. Alternatively, the event that all the specific patterns do not match with the particular (or, alternatively, predefined) pattern may occur due to the delay of the data strobe signal DQS or the distortion of the data signal DQ, as illustrated in FIG. 7A or 7B. In this case, the memory controller 110 and the nonvolatile memory device 120 may perform the re-training operation or the re-locking operation such that the data strobe signal DQS is center-aligned with the data signal DQ.

Figure 8:
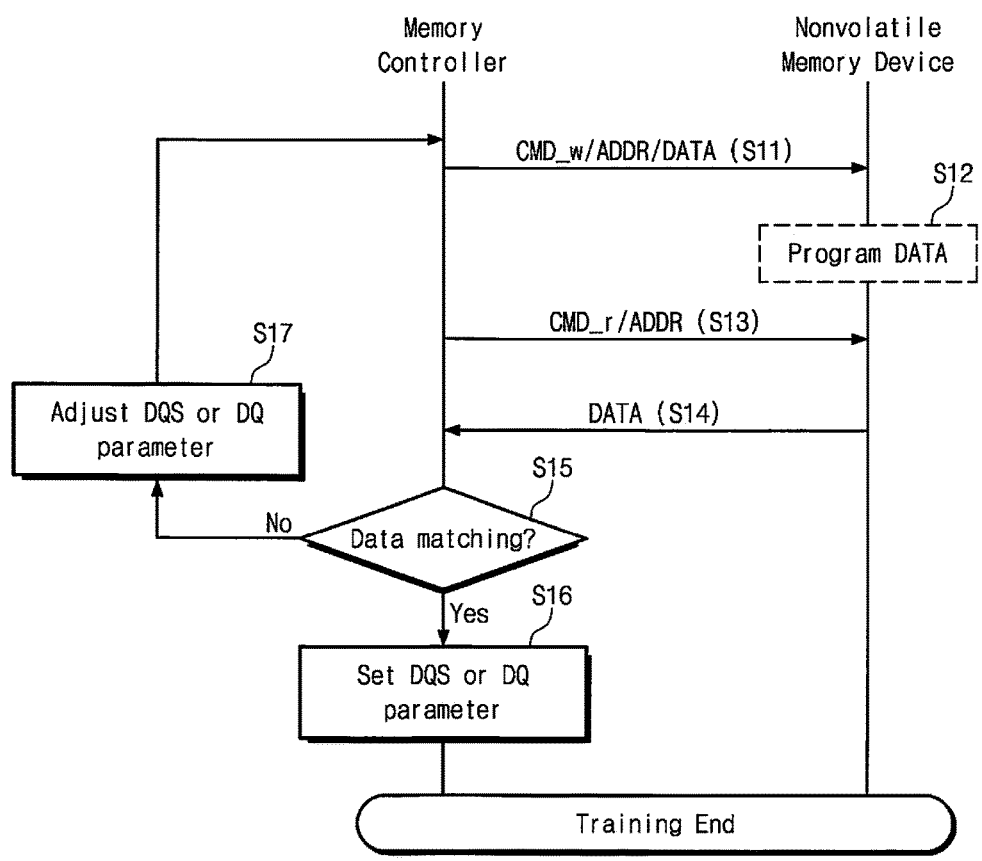
FIG. 8 is a flowchart illustrating a re-training operation being one of recovery operations according to the inventive concepts.

FIG. 8 is a flowchart illustrating a re-training operation being one of recovery operations according to the inventive concepts. Some or all of the operations illustrated to be performed in FIG. 8 may be performed at a nonvolatile memory device, including the nonvolatile memory device 120 as described herein, and a memory controller, including the memory controller 110 as described herein. As described herein with regard to at least FIG. 8, the memory controller 110 may be replaced with an "external device." Referring to FIGS. 1 and 8, in operation S11, the memory controller 110 transmits a program command CMD_p, an address ADDR, and data to the nonvolatile memory device 120. For example, as described above, the memory controller 110 may provide the nonvolatile memory device 120 with the program command CMD_p, the address ADDR, and the data by using the control signal CTRL, the data strobe signal DQS, and the data signal DQ.

In some example embodiments, the program command CMD_p may be a first set (e.g., 63h) of a write DQ training command, the address ADDR may be a logical unit number LUN, and the data may have a particular (or, alternatively, predefined) size. In some example embodiments, information about ("information associated with") the particular (or, alternatively, predefined) size of the data may be set in the nonvolatile memory device 120. The memory controller 110 may recognize the particular (or, alternatively, predefined) size through a get feature operation.

In operation S12, the nonvolatile memory device 120 may program received data. In some example embodiments, operation S12 may be omitted.

In operation S13, the memory controller 110 may transmit a command CMD_r and an address ADDR to the nonvolatile memory device 120. In some example embodiments, the read command CMD_r may be a second set (e.g., 64h) of the write DQ training command, and the address ADDR may be a logical unit number LUN.

In operation S14, the nonvolatile memory device 120 may provide data to the memory controller 110 in response to the read command CMD_r and the address ADDR.

In operation S15, the memory controller 110 may determine whether the received data matches with the transmitted data. If the received data matches with the transmitted data, in operation S16, the memory controller 110 may set or store a parameter associated with the data strobe signal DQS and the data signal DQ. If the received data do not match with the transmitted data, in operation S17, the memory controller 110 may adjust the parameter associated with the data strobe signal DQS and the data signal DQ. Afterwards, the memory controller 110 and the nonvolatile memory device 120 may repeatedly perform operation S11 to operation S15.

In some example embodiments, in the case where ("in response to a determination that") the program operation corresponding to operation S12 is omitted, the nonvolatile memory device 120 may provide the memory controller 110 with data stored in a page buffer circuit or an input/output circuit in response to the read command CMD_r without a separate program operation.

As described above, the memory controller 110 and the nonvolatile memory device 120 may appropriately set parameters associated with the data strobe signal DQS and the data signal DQ by repeatedly perform a write operation and a read operation such that data are normally transmitted and received. In some example embodiments, the operating method illustrated in FIG. 8 is a write training operation. However, the inventive concepts are not limited thereto. For example, the re-training operation may include at least one of a ZQ calibration operation, a duty cycle correction (DCC) training operation, a read training operation, or a write training operation.

Figure 9:
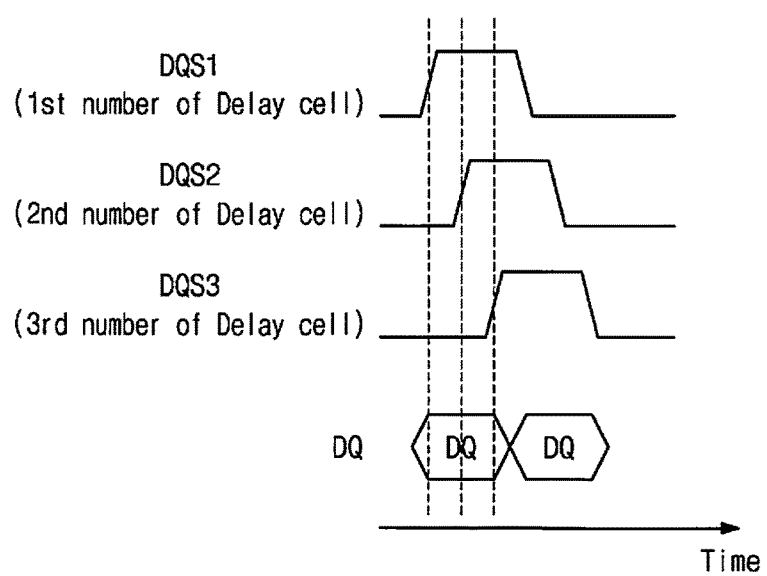
FIG. 9 is a view for describing a re-locking operation being one of recovery operations according to the inventive concepts.

FIG. 9 is a view for describing a re-locking operation being one of recovery operations according to the inventive concepts. Referring to FIGS. 1 and 9, the memory controller 110 may include a driver (not illustrated) for driving the data strobe signal DQS. The driver may include a plurality of delay cells for adjusting the timing of the data strobe signal DQS. The memory controller 110 may activate the plurality of delay cells to allow the data strobe signal DQS to be center-aligned with the data signal DQ.

For example, as illustrated in FIG. 9, the memory controller 110 may generate a first data strobe signal DQS1. The first data strobe signal DQS1 may be a data strobe signal that is generated when the first number of delay cells is activated. The memory controller 110 may generate a second data strobe signal DQS2. The second data strobe signal DQS2 may be a data strobe signal that is generated when the second number of delay cells is activated. The memory controller 110 may generate a third data strobe signal DQS3. The third data strobe signal DQS3 may be a data strobe signal that is generated when the third number of delay cells is activated.

As illustrated in FIG. 9, the second data strobe signal DQS2 may be a signal that is center-aligned with the data signal DQ. The memory controller 110 may generate an appropriate data strobe signal DQS by adjusting the number of delay cells to be activated for adjustment of the timing of the data strobe signal DQS, as described above. In some example embodiments, the memory controller 110 may perform the above-described re-locking operation by using a separate clock signal, instead of the data strobe signal DQS.

In some example embodiments, some (e.g., the re-training operation and the re-locking operation) of the recovery operations are described with reference to FIGS. 8 and 9. However, the examples of the recovery operations are exemplary, not limiting the scope and spirit of the inventive concepts. The recovery operation may include various operations, which are capable of correcting the distortion of the data strobe signal DQS or the data signal DQ, such as a re-training operation, a re-locking operation, an operation of changing an operating voltage, an operation of changing an operating frequency, and a reset operation.

Figure 10:
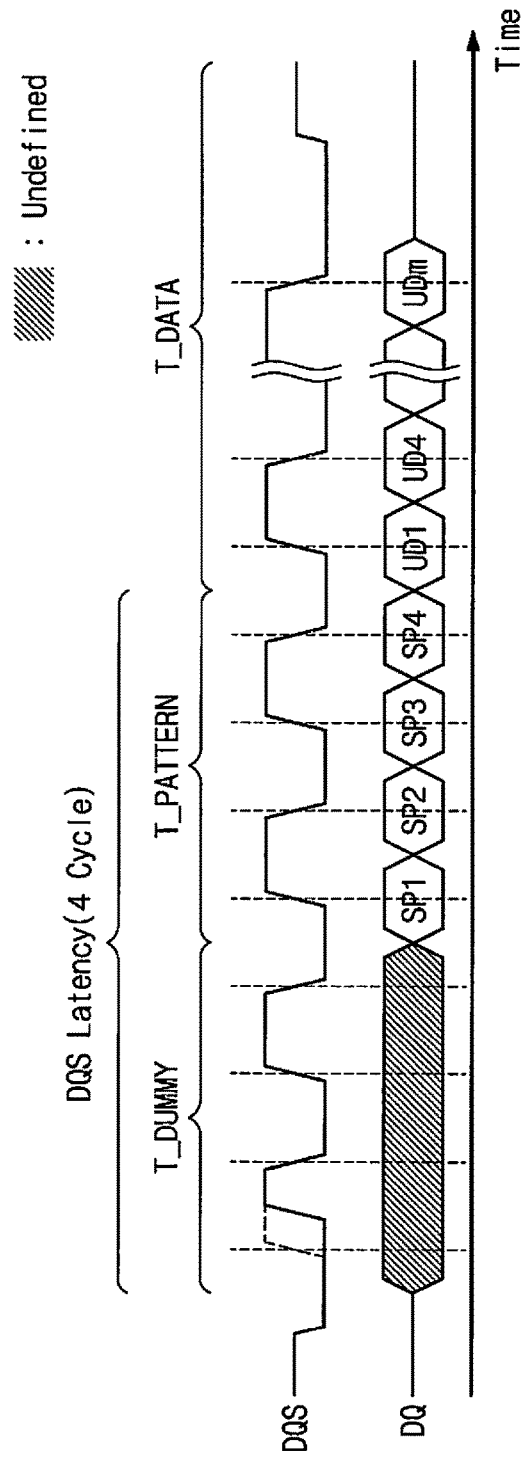
FIG. 10 is a timing diagram illustrating how data are input to the nonvolatile memory device of FIG. 1.

FIG. 10 is a timing diagram illustrating how data are input to a nonvolatile memory device of FIG. 1. For a brief description, a description given with reference to the above-described components will not be repeated here.

Referring to FIGS. 1 and 10, the nonvolatile memory device 120 may receive, from the memory controller 110, the first to fourth specific patterns SP1 to SP4 during the pattern period T_PATTERN and the user data UD1 to UDm during the data period T_DATA. In this case, the dummy period T_DUMMY may exist before ("prior to") the pattern period T_PATTERN. In some example embodiments, the dummy period T_DUMMY may provide the same function as the dummy period T_DUMMY described with reference to FIG. 3B. For example, the nonvolatile memory device 120 may process signals received through the data signal DQ during the dummy period T_DUMMY as dummy data.

Afterwards, the nonvolatile memory device 120 may receive the first to fourth specific patterns SP1 to SP4 through the data signal DQ during some next cycles (e.g., the pattern period T_PATTERN of FIG. 10) of the data strobe signal DQS.

The nonvolatile memory device 120 may perform a pattern check operation for determining whether the received first to fourth specific patterns SP1 to SP4 match with the particular (or, alternatively, predefined) pattern and may perform or may not perform a program operation on the user data UD1 to UDm received during a next data period T_DATA depending on the pattern check result.

To implement some example embodiments, including the example embodiments illustrated in FIG. 10, the "DQS latency for WRITE" for a write operation of the nonvolatile memory device 120 may be set to 4 cycles. A DQS latency period may include the dummy period T_DUMMY and the pattern period T_PATTERN. That is, in the "DQS latency for WRITE", a partial period may be used as the dummy period T_DUMMY, and the remaining period may be used as the pattern period T_PATTERN. In some example embodiments, each of the length of the dummy period T_DUMMY and the length of the pattern period T_PATTERN may be set by a set feature operation, such that each of the length of the dummy period T_DUMMY and the length of the pattern period T_PATTERN may be defined based on a set feature operation.

Figure 11A:
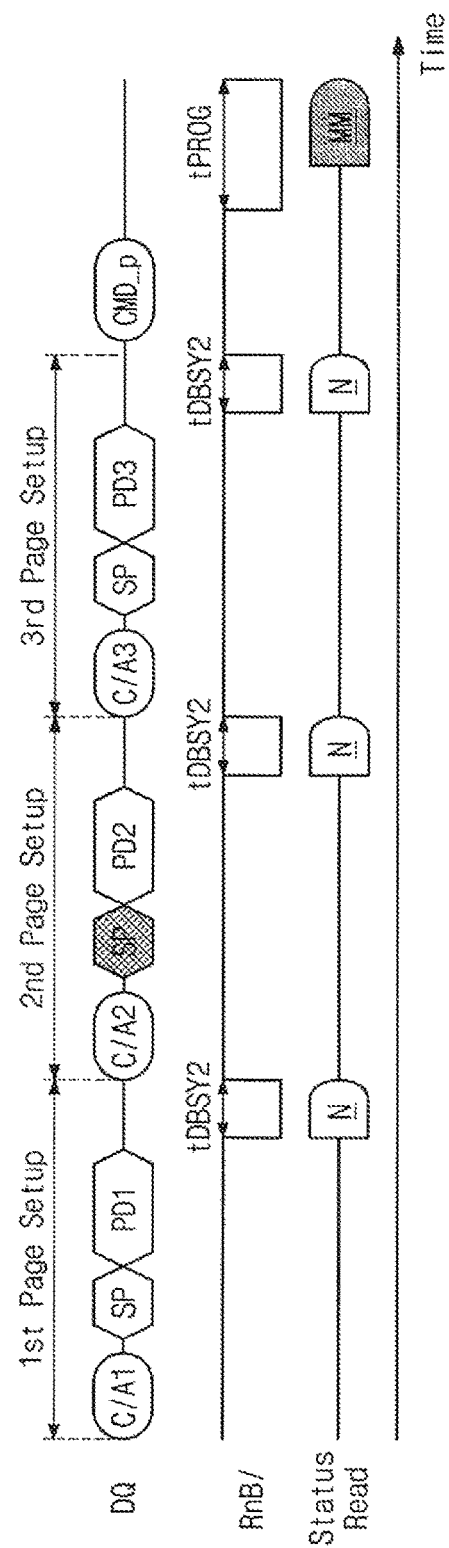
FIG. 11A and FIG. 11B are timing diagrams illustrating a program operation of the nonvolatile memory device of FIG. 1.
Figure 11B:
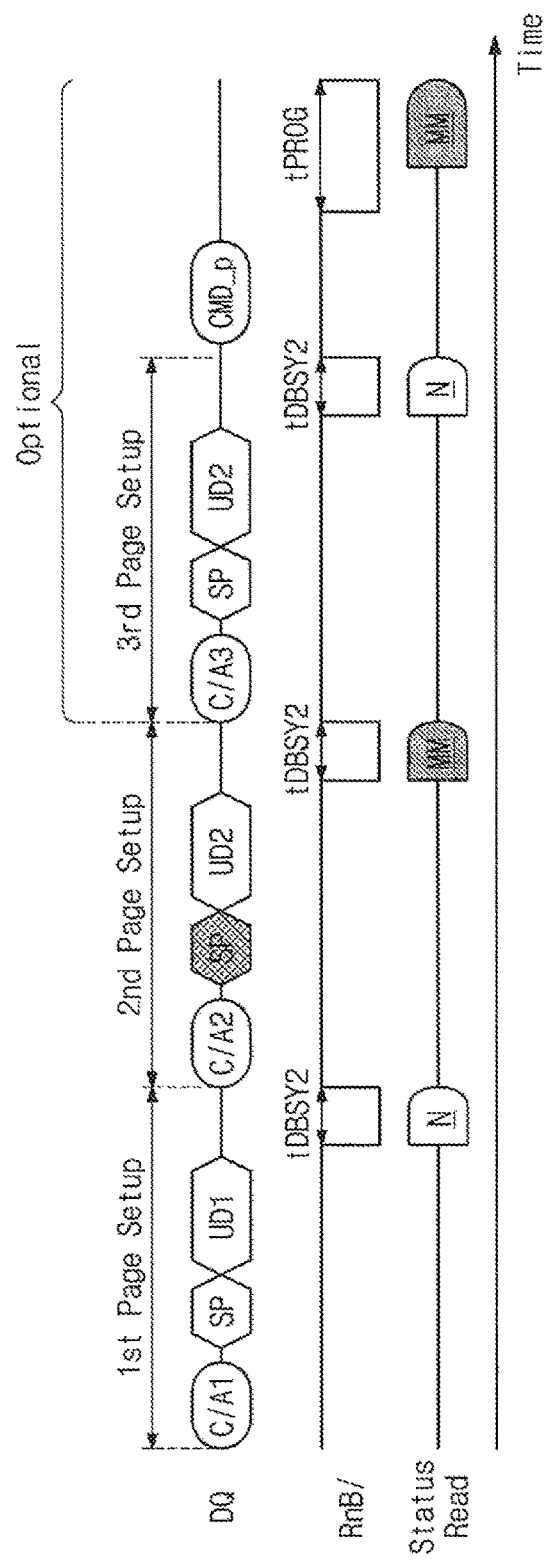

FIGS. 11A and 11B are timing diagrams illustrating a program operation of a nonvolatile memory device of FIG. 1. For a brief description, detailed configurations of the command CMD, the address ADDR, and the control signal CTRL are omitted. Also, for brevity of illustration, a value associated with a status read operation is illustrated with a line separate from a line for the data signal DQ, but the value associated with the status read operation may be provided to the memory controller 110 through the data signal DQ in response to a status read command. Also, for convenience of description, some example embodiments of the inventive concepts will be described on the basis of a 3-page program operation, and it is assumed that the specific pattern SP received in a second page setup period is mismatched with a particular (or, alternatively, predefined) pattern (i.e., the received specific pattern SP does not match with the particular (or, alternatively, predefined) pattern).

In some example embodiments, for brevity of illustration, in each page setup period, a command or an address (e.g., a dump command and a buffer address) received following page data PD are omitted in FIGS. 11A and 11B.

Referring to FIGS. 1, 11A, and 11B, in a first page setup period, the nonvolatile memory device 120 may receive a first command/address C/A1, may receive the specific pattern SP, and may receive first page data PD1 (i.e., user data). In some example embodiments, the first command/address C/A1 may refer to a command for a setup operation associated with the first page data PD1 and an address of a region where the first page data PD1 will be stored. In some example embodiments, the first command/address C/A1, the specific pattern SP, and the first page data PD1 may be distinguished or recognized by the control signal CTRL and the data strobe signal DQS. Afterwards, during a dummy busy time tDBSY2, the nonvolatile memory device 120 may dump the received first page data PD1 onto the page buffer circuit 124.

During the second page setup period, the nonvolatile memory device 120 may receive a second command/address C/A2, the specific pattern SP, and may receive second page data PD2 (i.e., user data). In some example embodiments, the second command/address C/A2 may refer to a command for a setup operation associated with the second page data PD2 and an address of a region where the second page data PD2 will be stored. Afterwards, during a dummy busy time tDBSY2, the nonvolatile memory device 120 may dump the received second page data PD2 onto the page buffer circuit 124.

During a third page setup period, the nonvolatile memory device 120 may receive a third command/address C/A3, the specific pattern SP, and may receive third page data PD3 (i.e., user data). In some example embodiments, the third command/address C/A3 may refer to a command for a setup operation associated with the third page data PD3 and an address of a region where the third page data PD3 will be stored. Afterwards, during a dummy busy time tDBSY2, the nonvolatile memory device 120 may dump the received page data PD3 onto the page buffer circuit 124.

Afterwards, the nonvolatile memory device 120 may receive a program confirm command CMD_c from the memory controller 110 and may perform a program operation on the first to third page data PD1 to PD3 during a program time t_PROG in response to the received program confirm command CMD_c. Performing the program operation may include providing information associated with the program failure from the nonvolatile memory device to the external device as status information based on a request of the external device, as described above with reference to operations S152-153 in FIG. 6, including providing the status information from the nonvolatile memory device 120 to an external device (e.g., memory controller 110) in response to a determination that a program confirm command CMD_c is received at the nonvolatile memory device from the external device. In some example embodiments, the nonvolatile memory device 120 may provide the status information from the nonvolatile memory device 120 to the external device prior to a program confirm command CMD_c being received at the nonvolatile memory device 120 from the external device.

In some example embodiments, as described above, the specific pattern SP received in the second page setup period may not match with the particular (or, alternatively, predefined) pattern. In this case, the nonvolatile memory device 120 may set status information to pattern mismatch information M/M. In this case, the nonvolatile memory device 120 may not perform a program operation on the first to third page data PD1 to PD3 and may provide the pattern mismatch information M/M to the memory controller 110 in response to the status read command of the memory controller 110.

For example, the memory controller 110 may provide the status read command to the nonvolatile memory device 120 during each dummy busy time tDBSY2 and may receive status information from the nonvolatile memory device 120. As illustrated in FIG. 11A, the nonvolatile memory device 120 may provide the pattern mismatch information M/M to the memory controller 110 in a status read operation after the program confirm command CMD_c. That is, the nonvolatile memory device 120 may provide normal information "N" representing a normal state in the status read operation during the dummy busy time tDBSY2 of each of the first to third page setup periods and may provide the pattern mismatch information M/M to the memory controller 110 in a status read operation after the program confirm command CMD_c.

Alternatively, as illustrated in FIG. 11B, the nonvolatile memory device 120 may provide the pattern mismatch information M/M to the memory controller 110 in a status read operation that is performed during the dummy busy time tDBSY2 of the second page setup period in which pattern mismatch occurs. In this case, the memory controller 110 may perform a recovery operation after performing an operation of the third page setup period or without performing an operation of the third page setup period.

As described above, through the status read operation, the memory controller 110 may receive status information about a pattern check operation from the nonvolatile memory device 120 and may perform a recovery operation based on the received status information.

Figure 12:
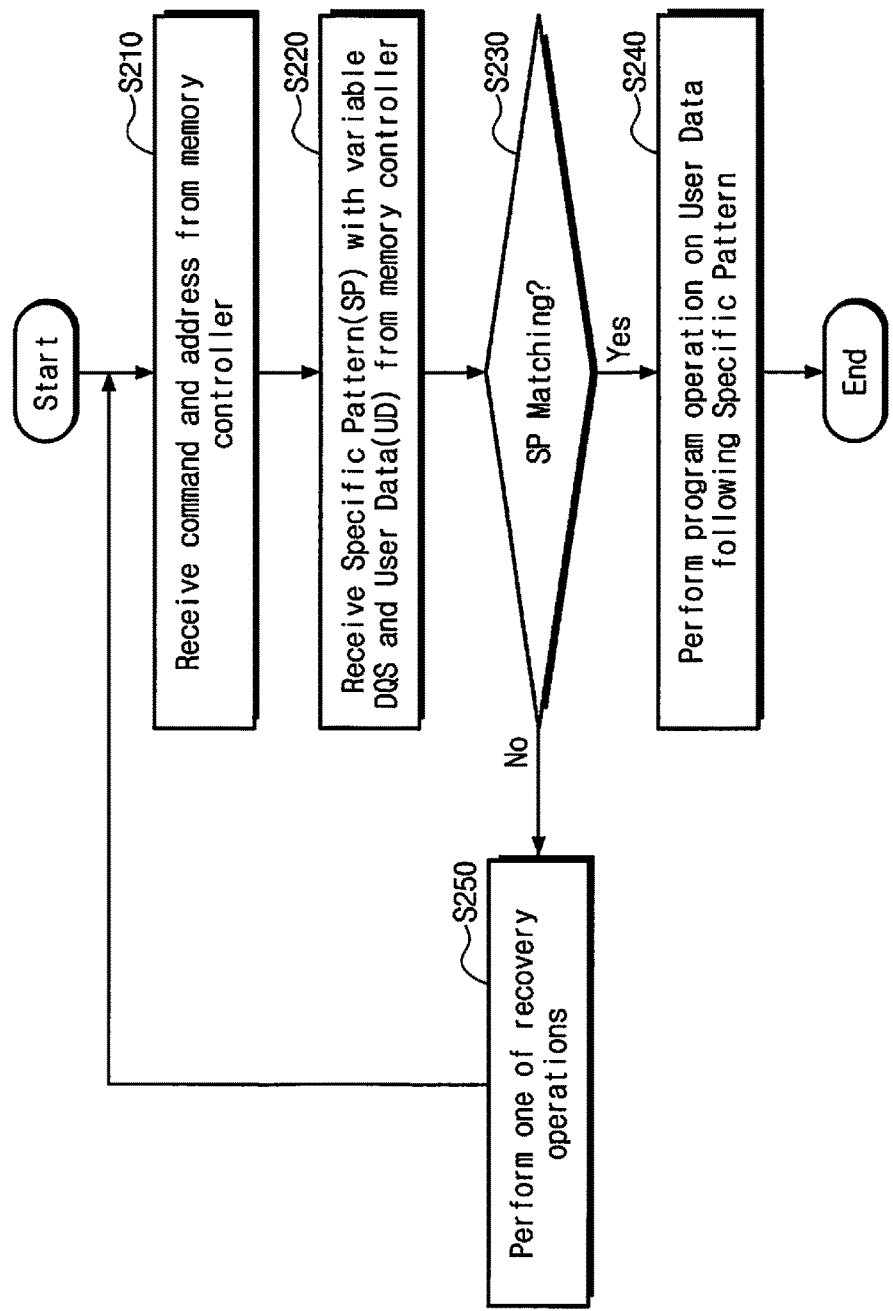
FIG. 12 is a flowchart illustrating an operation of the nonvolatile memory device of FIG. 1.

FIG. 12 is a flowchart illustrating an operation of a nonvolatile memory device of FIG. 1. Some or all of the operations illustrated to be performed in FIG. 12 may be performed at a nonvolatile memory device, including the nonvolatile memory device 120 as described herein. As described herein with regard to at least FIG. 12, the memory controller 110 may be replaced with an "external device." Referring to FIGS. 1 and 12, in operation S210, the nonvolatile memory device 120 may receive the command CMD and the address ADDR from the memory controller 110. Operation S210 is similar to operation S110 of FIG. 4, and a detailed description thereof is thus omitted.

In operation S220, the nonvolatile memory device 120 may receive the specific pattern SP from the memory controller 110 together with a variable data strobe signal DQS', and then, may receive the user data UD. For example, as described above, the nonvolatile memory device 120 may receive the specific pattern SP during the pattern period T_PATTERN. In this case, a duty rate of the data strobe signal DQS may be changed to check a window of the data signal DQ.

The memory controller 110 may adjust the data strobe signal DQS such that a rising edge or a falling edge of the data strobe signal DQS is aligned with a left edge or a right edge of the window of the data signal DQ determined in advance. That is, in the case where the rising edge or the falling edge of the data strobe signal DQS is aligned with the left edge or the right edge of the window of the data signal DQ, the case where the specific pattern SP is normally identified may mean that a window range of the data signal DQ determined in advance is accurate. However, the case where the specific pattern SP is not normally identified may mean that the window range of the data signal DQ is inaccurate.

Afterwards, the nonvolatile memory device 120 may perform operation S230 to operation S250. Operation S230 to operation S250 (including operation S240) may be similar to operation S130 to operation S150 (including operation S140) of FIG. 4, and a detailed description thereof is thus omitted.

As described above, the nonvolatile memory device 120 according to the inventive concepts may include the pattern period T_PATTERN to receive the specific pattern SP before a data period to receive the user data UD. The nonvolatile memory device 120 may perform or may not perform a program operation on the user data UD, based on a pattern check result of the specific pattern SP received in the pattern period T_PATTERN. Alternatively, the nonvolatile memory device 120 may perform at least one of various recovery operations based on the pattern check result of the specific pattern SP received in the pattern period T_PATTERN. Alternatively, the nonvolatile memory device 120 may check whether the window of the data signal DQ is accurate, by using a variable data strobe signal in the pattern period T_PATTERN.

Figure 13:
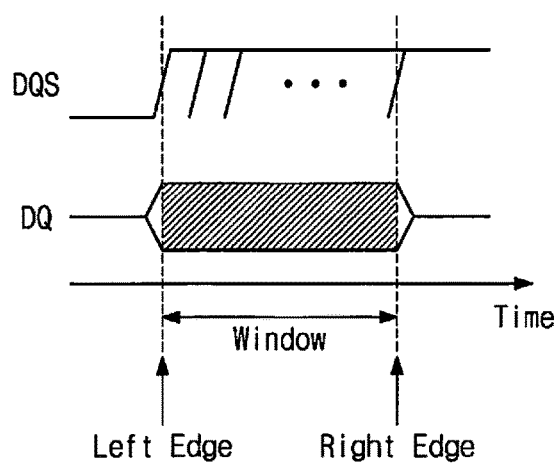
FIG. 13 is a view for describing a window of a data signal.

FIG. 13 is a view for describing a window of a data signal. Referring to FIG. 13, the data signal DQ may include a window of a specific range. In the case where a rising edge or a falling edge of the data strobe signal DQS is included in the window of the data signal DQ, the data signal DQ may be normally recognized by the nonvolatile memory device 120. Generally, for accurate data recognition, the data strobe signal DQS is generated such that a rising edge or a falling edge of the data strobe signal DQS is aligned with the center of the window of the data signal DQ (i.e., is center-aligned with the window).

In contrast, in the case where the rising edge or the falling edge of the data strobe signal DQS is out of the range of the window (i.e., in the case where the rising edge or the falling edge of the data strobe signal DQS leads a left edge of the window or lags behind a right edge of the window), the data signal DQ may not be correctly recognized. In some example embodiments, the window of the data signal DQ, the left edge of the window, or the right edge of the window may be predetermined through a training operation between the memory controller 110 and the nonvolatile memory device 120.

Figure 14A:
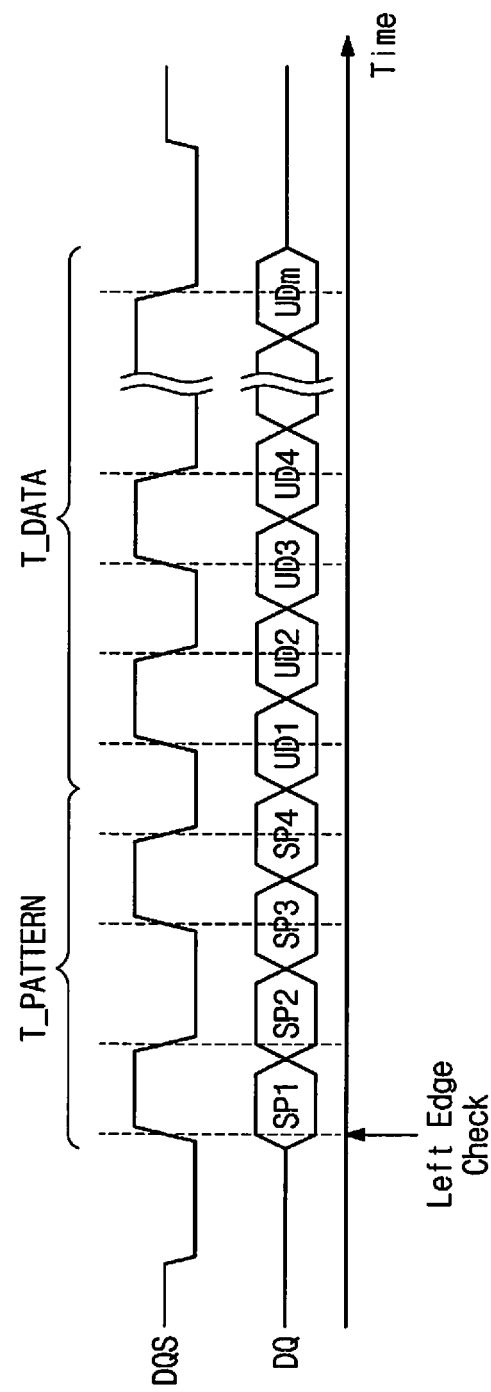
FIG. 14A, FIG. 14B, and FIG. 14C are timing diagrams illustrating how data are input to the nonvolatile memory device.
Figure 14B:
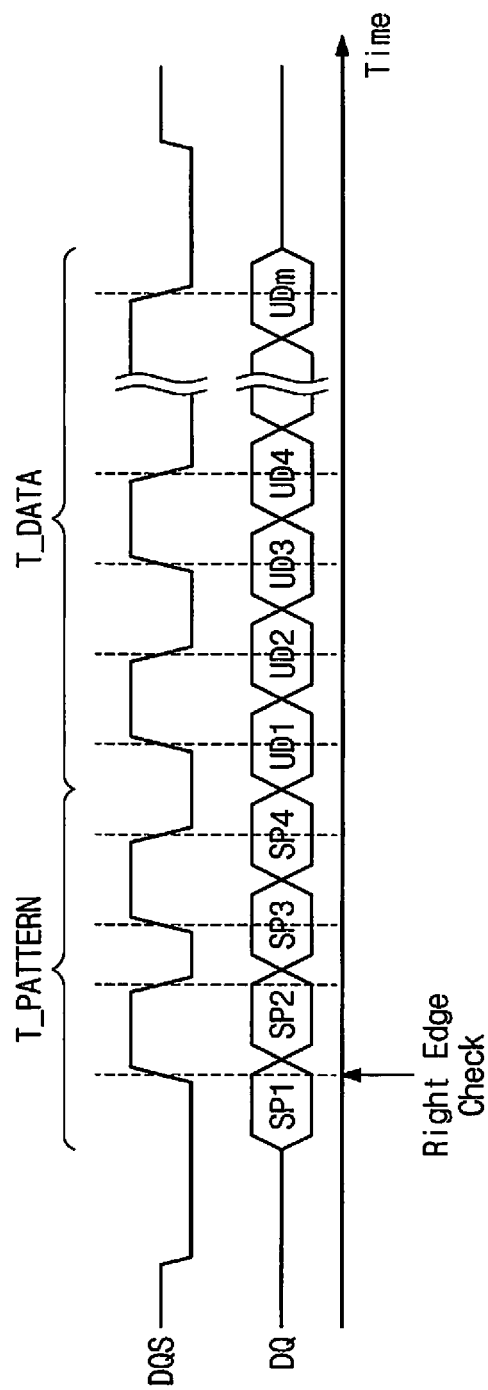
Figure 14C:
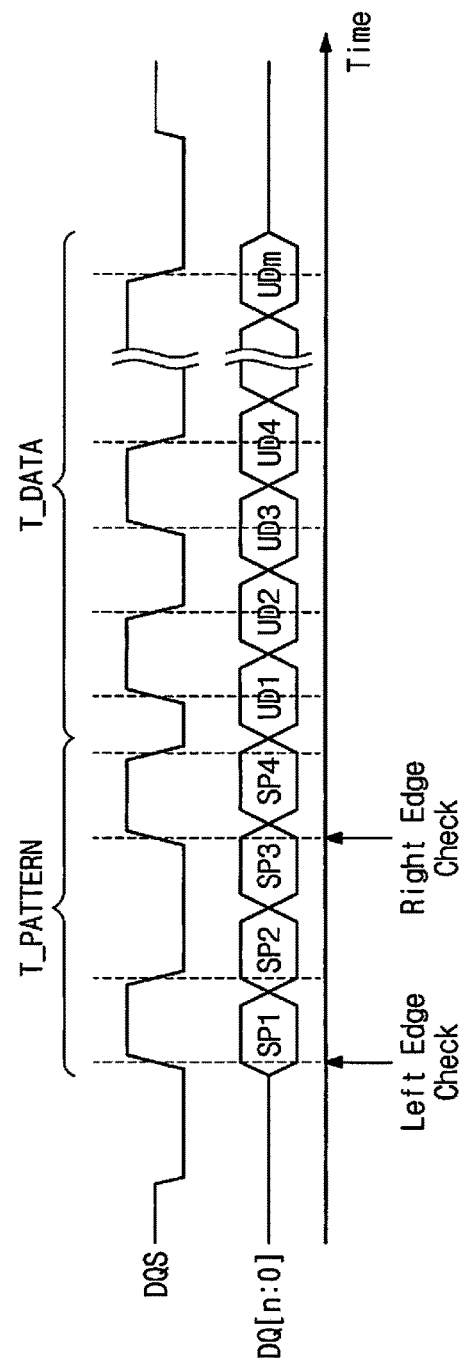

FIGS. 14A to 14C are timing diagrams illustrating how data are input to a nonvolatile memory device. In the timing diagrams of FIGS. 14A to 14C, a horizontal axis represents a time (e.g., "elapsed time from an origin point"). Referring to FIGS. 1 and 14A to 14C, the nonvolatile memory device 120 may receive the first to fourth specific patterns SP1 to SP4 during the pattern period T_PATTERN and the user data UD1 to UDm during the data period T_DATA. In this case, the memory controller 110 may adjust a delay of the data strobe signal DQS for the purpose of checking a window of the data signal DQ.

For example, as illustrated in FIG. 14A, the data strobe signal DQS may be generated such that a rising edge and a falling edge of a first period of the data strobe signal DQS are aligned with a left edge of a window of the data signal DQ. In this case, if the first specific pattern SP1 and the second specific pattern SP2 are normally recognized by the nonvolatile memory device 120, information about the left edge of the window of the data signal DQ may be determined as being accurate; if the first specific pattern SP1 or the second specific pattern SP2 is not normally recognized by the nonvolatile memory device 120, information about the left edge of the window of the data signal DQ may be determined as being inaccurate.

As illustrated in FIG. 14B, the data strobe signal DQS may be generated such that the rising edge and the falling edge of the first period of the data strobe signal DQS are aligned with a right edge of the window of the data signal DQ. If the first specific pattern SP1 and the second specific pattern SP2 are normally recognized by the nonvolatile memory device 120, information about the right edge of the window of the data signal DQ may be determined as being accurate; if the first specific pattern SP1 or the second specific pattern SP2 is not normally recognized by the nonvolatile memory device 120, information about the right edge of the window of the data signal DQ may be determined as being inaccurate.

As illustrated in FIG. 14C, the data strobe signal DQS may be generated such that the rising edge and the falling edge of the first period of the data strobe signal DQS are aligned with the left edge of the window of the data signal DQ and such that the rising edge and the falling edge of a second period of the data strobe signal DQS are aligned with the right edge of the window of the data signal DQ. As in the above description, the accuracy of values determined in advance with regard to the window of the data signal DQ may be determined according to a pattern check result of the first to fourth specific patterns SP1 to SP4.

As described above, during the pattern period T_PATTERN, the memory controller 110 may vary a delay or a duty rate of the data strobe signal DQS such that the window of the data signal DQ is checked.

Figure 15:
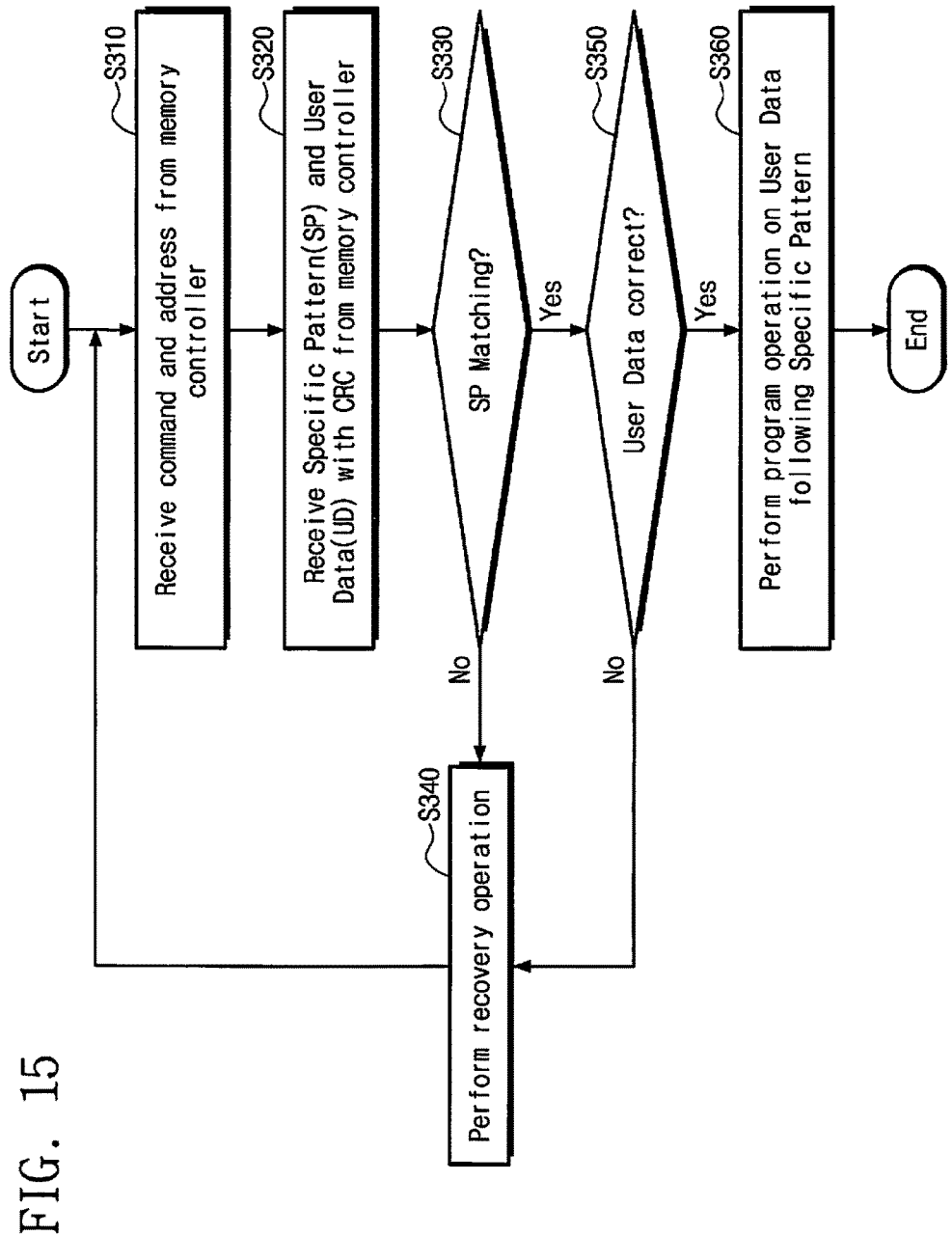
FIG. 15 is a flowchart illustrating an operation of the nonvolatile memory device of FIG. 1.
Figure 16:
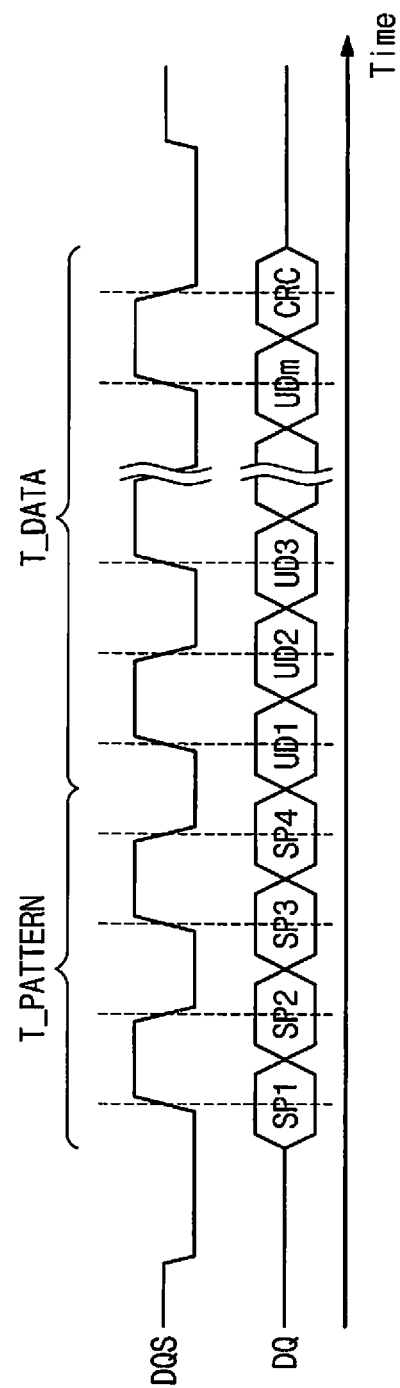
FIG. 16 is a timing diagram illustrating how data are input to the nonvolatile memory device depending on the flowchart of FIG. 15.

FIG. 15 is a flowchart illustrating an operation of a nonvolatile memory device of FIG. 1. FIG. 16 is a timing diagram illustrating how data are input to a nonvolatile memory device of FIG. 15. In the timing diagram of FIG. 16, a horizontal axis represents a time ("elapsed time from an origin point"). Some or all of the operations illustrated to be performed in FIG. 15 may be performed at a nonvolatile memory device, including the nonvolatile memory device 120 as described herein. As described herein with regard to at least FIG. 15, the memory controller 110 may be replaced with an "external device."

Referring to FIGS. 1, 15, and 16, in operation S310, the nonvolatile memory device 120 may receive a command and an address from the memory controller 110. Operation S310 is similar to operation S110 of FIG. 4, and a detailed description thereof is thus omitted.

In operation S320, the nonvolatile memory device 120 may receive a specific pattern from the memory controller 110, and then, may receive the user data UD and a cyclical redundancy check (CRC) code. Restated, the nonvolatile memory device 120 may receive user data US and a cyclic redundancy check CRC code from an external device (e.g., memory controller 110) through the data signal DQ and the data strobe signal DQS in a data period. The CRC code may refer to data for detecting an error of the user data UD. For example, as illustrated in FIG. 16, the nonvolatile memory device 120 may receive the first to fourth specific patterns SP1 to SP4 during the pattern period T_PATTERN. Afterwards, the nonvolatile memory device 120 may receive the plurality of user data UD1 to UDm and the CRC code during the data period T_DATA. The CRC code may refer to data for detecting an error of the plurality of user data UD1 to UDm, and the nonvolatile memory device 120 may determine whether the plurality of user data UD1 to UDm are normally received, by using the CRC code.

In operation S330, the nonvolatile memory device 120 may determine whether the specific pattern SP is matched with the particular (or, alternatively, predefined) pattern. If the specific pattern SP does not match with the particular (or, alternatively, predefined) pattern (e.g., based on a determination that the specific pattern SP does not match with the particular (or, alternatively, predefined) pattern), the nonvolatile memory device 120 may perform operation S340. Operation S340 is similar to operation S150 of FIG. 4, and a detailed description thereof is thus omitted.

If the received specific pattern SP matches with the particular (or, alternatively, predefined) pattern, in operation S350 (e.g., based on a determination that the received specific pattern SP matches with the particular (or, alternatively, predefined) pattern), the nonvolatile memory device 120 may perform whether the received user data UD are accurate, based on the CRC code. In other words, the nonvolatile memory device 120 may determine whether an error is included in the user data UD, by using the CRC code.

If the received user data UD are accurate, the nonvolatile memory device 120 performs operation S360. Operation S360 is similar to operation S140 of FIG. 4, and a detailed description thereof is thus omitted. If the received user data UD are inaccurate, the nonvolatile memory device 120 performs operation S340.

Restated above, some or all of operations S330-S360 may be collectively referred to as the nonvolatile memory device 120 selectively performing a program operation on the user data (S360) or a recovery operation at the nonvolatile memory device (S340) based on a determination of whether the specific pattern matches with a particular (or, alternatively, predefined) pattern (S330=YES or NO) and an error is detected from the user data based on the CRC code (S350=YES or NO). Based on a determination that both S330=YES and S350=YES, operation S360 is selectively performed, and if either S330=NO or S350=NO, operation S340 is selectively performed. Such selectively performing may be referred to herein as selectively performing a recovery operation (S340) based on a determination of whether the specific pattern fails to match with a particular pattern (S330=NO) and/or whether an error is detected from the user data based on the CRC code (S350=NO).

The nonvolatile memory device 120 may process the program operation as program failure without performing the program operation on the user data UD, similarly as described above, based on a determination that the specific pattern SP does not match with the particular pattern (S330=NO) or if the error is detected from the user data based on the CRC code (S350=NO). The nonvolatile memory device 120 may provide information associated with the program failure from the nonvolatile memory device to an external device as status information, similarly as described above.

As described above, based on a pattern check result of the specific pattern SP received in the pattern period T_PATTERN, the nonvolatile memory device 120 may perform a program operation on the user data UD or may perform a recovery operation. In some example embodiments, even though the specific pattern SP matches with the particular (or, alternatively, predefined) pattern, the data strobe signal DQS may be distorted due to various factors (e.g., changes in temperature, voltage, and speed) during the data period T_DATA. In this case, even though the specific pattern SP matches with the particular (or, alternatively, predefined) pattern, the user data UD may not be normally received. Accordingly, the nonvolatile memory device 120 may check the accuracy or error of the user data UD by using the CRC code of the user data UD, as well as the pattern check operation. This may mean that the reliability of user data is improved, and thus the functionality of the nonvolatile memory device 120 may be improved.

Figure 17:
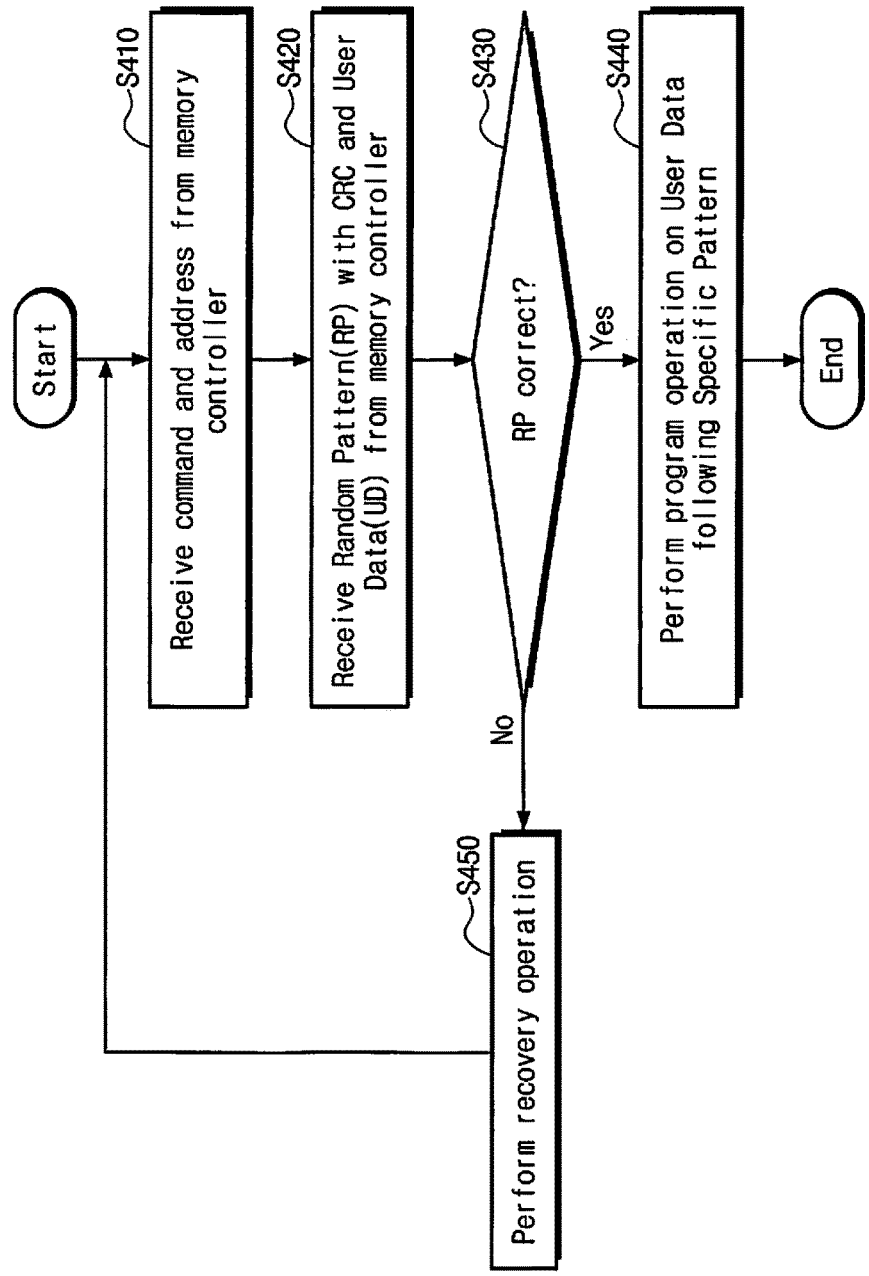
FIG. 17 is a flowchart illustrating an operation of the nonvolatile memory device of FIG. 1.
Figure 18:
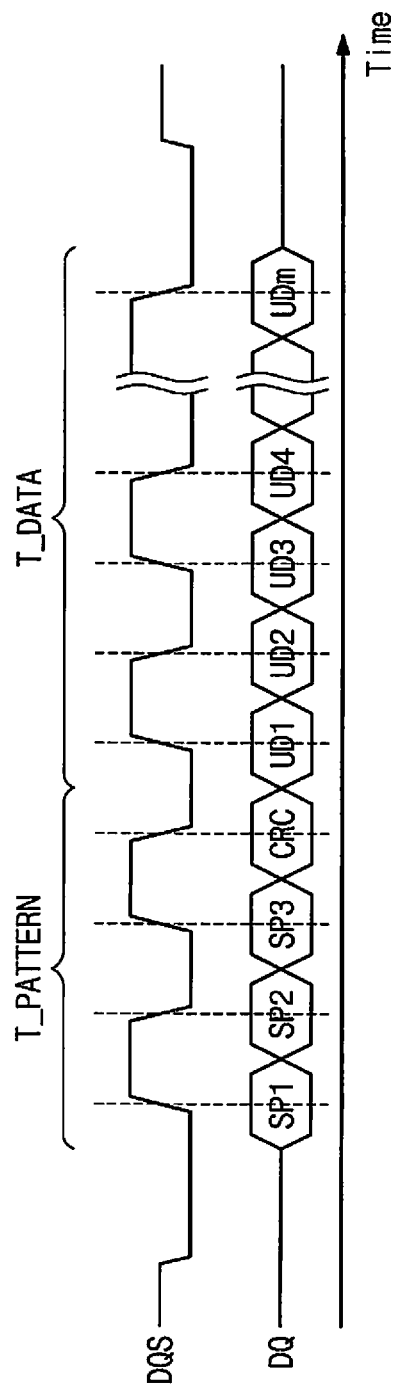
FIG. 18 is a timing diagram illustrating how data are input to the nonvolatile memory device of FIG. 17 depending on the flowchart of FIG. 17.

FIG. 17 is a flowchart illustrating an operation of a nonvolatile memory device of FIG. 1. FIG. 18 is a timing diagram illustrating how data are input to a nonvolatile memory device depending on the flowchart of FIG. 17. Some or all of the operations illustrated to be performed in FIG. 17 may be performed at a nonvolatile memory device, including the nonvolatile memory device 120 as described herein. As described herein with regard to at least FIG. 17, the memory controller 110 may be replaced with an "external device." Referring to FIGS. 1, 17, and 18, in operation S410, the nonvolatile memory device 120 may receive a command and an address from the memory controller 110. Operation S410 is similar to operation S110 of FIG. 4, and a detailed description thereof is thus omitted.

In operation S420, the nonvolatile memory device 120 may receive a random pattern RP and a CRC code from the memory controller 110, and then, may receive the user data UD. For example, in the above-described embodiments, during the pattern period T_PATTERN, the nonvolatile memory device 120 receives the particular (or, alternatively, predefined) specific pattern SP and performs a pattern check operation on the received specific pattern SP. Unlike the above description, as illustrated in FIG. 18, the nonvolatile memory device 120 may receive random patterns RP1 to RP3 and a CRC code instead of the specific pattern SP in the pattern period T_PATTERN and may receive the plurality of user data UD1 to UDm in the data period T_DATA. In some example embodiments, the random pattern RP may refer to random data, and the CRC code may refer to data for detecting an error of the random data.

In operation S430, the nonvolatile memory device 120 may determine whether the random pattern RP is accurate. For example, the nonvolatile memory device 120 may determine whether an error is included in the random patterns RP1 to RP3, by using the CRC code. In other words, the nonvolatile memory device 120 may determine whether the random patterns RP1 to RP3 are correctly received, by using the CRC code.

If the random patterns RP1 to RP3 are accurate, the nonvolatile memory device 120 may perform operation S440; if the random patterns RP1 to RP3 are inaccurate, the nonvolatile memory device 120 may perform operation S450. Operation S440 and operation S450 are similar to operation S140 and operation S150 of FIG. 4, and a detailed description thereof is thus omitted.

As described above, in the pattern period T_PATTERN, the nonvolatile memory device 120 may receive a random pattern RP and a CRC code instead of the particular (or, alternatively, predefined) specific pattern SP and may determine whether the received random pattern RP is correct, by using the CRC code. Accordingly, the reliability of user data may be secured, and thus the functionality of the nonvolatile memory device 120 may be improved.

Figure 19:
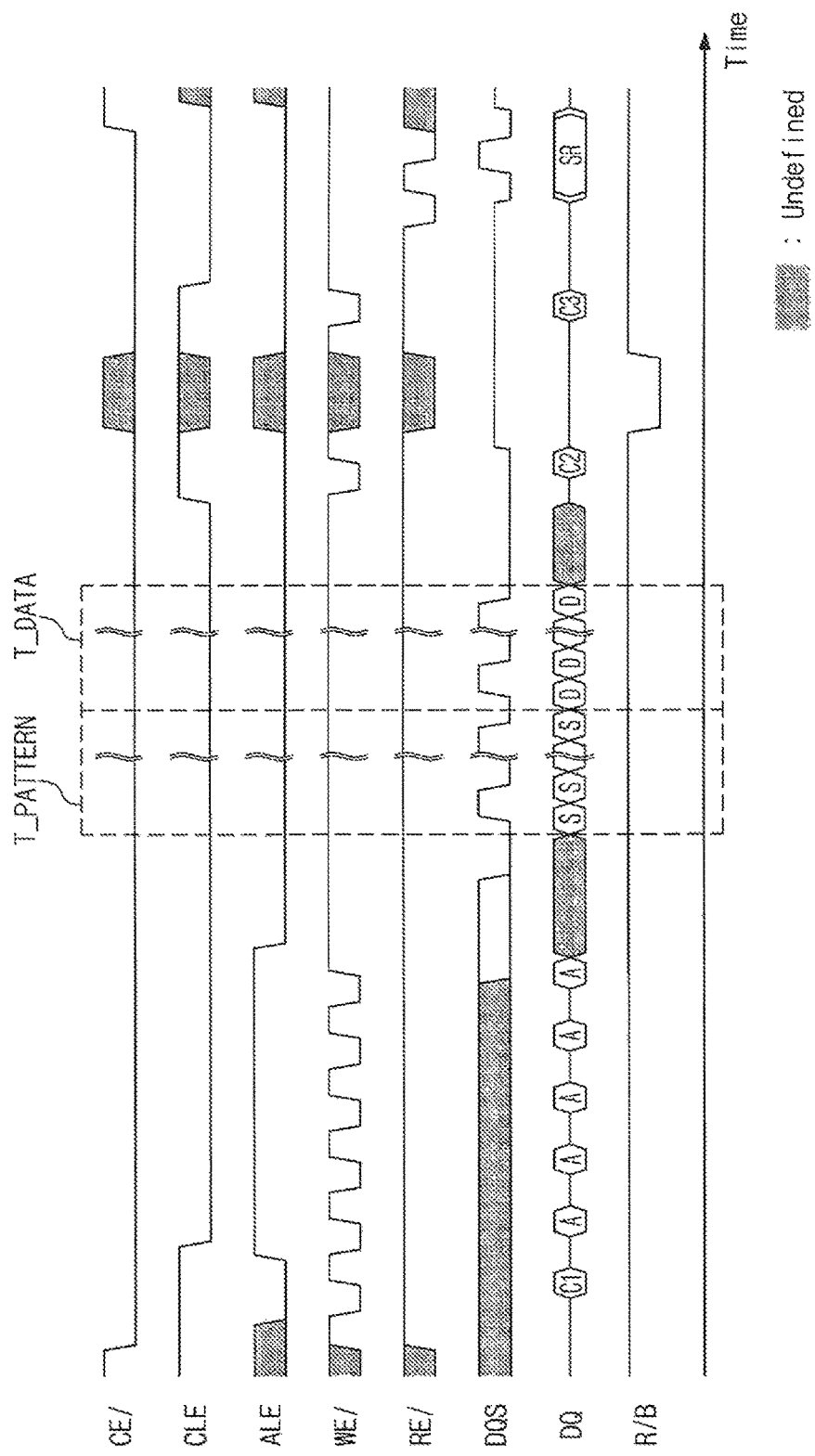
FIG. 19 is a timing diagram illustrating a page program operation according to some example embodiments of the inventive concepts.

FIG. 19 is a timing diagram illustrating a page program operation according to some example embodiments of the inventive concepts. For a brief description and for brevity of illustration, a program sequence is described with reference to signals provided to the nonvolatile memory device 120 of FIG. 1. For brevity of illustration, the respective signals are schematically illustrated, but the inventive concepts are not limited thereto.

In FIG. 19, a reference mark "S" means a specific pattern. This is simply for brevity of illustration, and it may be understood that the specific pattern "S" of FIG. 19 is configured to be the same as the above-described specific pattern SP.

In some example embodiments, a chip enable signal CE/, a command latch enable signal CLE, an address latch enable signal ALE, a write enable signal WE/, and a read enable signal RE/ may be included in the control signal CTRL provided from the memory controller 110. A ready/busy signal R/B may be a signal that is driven by the nonvolatile memory device 120 depending on an operation of the nonvolatile memory device 120.

In a page program operation, the chip enable signal CE/ is at a low level. Afterwards, when the command latch enable signal CLE is at a high level, a first command C1 is provided through the data signal DQ at a rising edge of the write enable signal WE/. When the address latch enable signal ALE is at a high level, addresses "A" are provided through the data signal DQ at a rising edge of the write enable signal WE/. In some example embodiments, the first command C1 may be a command (e.g., 80h) associated with a page program operation. The addresses "A" may include a column address and a row address.

Afterwards, the specific pattern "S" is provided through the data signal DQ in synchronization with the data strobe signal DQS during the pattern period T_PATTERN. Afterwards, user data "D" are provided through the data signal DQ in synchronization with the data strobe signal DQS during the data period T_DATA.

Afterwards, when the command latch enable signal CLE is at a high level, a second command C2 is provided through the data signal DQ at a rising edge of the write enable signal WE/. In some example embodiments, the second command C2 may be a program confirm command (e.g., 10h). The nonvolatile memory device 120 may perform a program operation on the received user data "D" in response to the second command C2. In some example embodiments, as described above, in the case where the specific pattern "S" does not match with the particular (or, alternatively, predefined) pattern, the program operation may not be performed. That is, the program operation may be omitted.

Afterwards, when the command latch enable signal CLE is at a high level, a third command C3 is provided through the data signal DQ at a rising edge of the write enable signal WE/. In some example embodiments, the third command C3 may be a status read command (e.g., 78h). In response to the third command C3, the nonvolatile memory device 120 may output status information SR through the data signal DQ in synchronization with the data strobe signal DQS that is synchronized with the read enable signal RE/.

In some example embodiments, as described above, in the case where the specific pattern "S" does not match with the particular (or, alternatively, predefined) pattern, the nonvolatile memory device 120 may skip a program operation of the user data "D". In the case where the specific pattern "S" does not match with the particular (or, alternatively, predefined) pattern, the status information SR output in response to the third command C3 may include information about pattern mismatch. The memory controller 110 may perform a recovery operation based on the status information SR including the information about the pattern mismatch.

As described above, according to some example embodiments of the inventive concepts, in a pattern period, a nonvolatile memory device may receive a specific pattern and may perform a pattern check operation on the received specific pattern. In some example embodiments, the pattern period may be included in the "DQS latency for WRITE". Depending on the pattern check result, the nonvolatile memory device may perform a recovery operation without performing the program operation on the user data. Accordingly, it may be possible to prevent a data error due to distortion of the data signal DQ or the data strobe signal DQS coming from various factors. This may mean that the performance of the nonvolatile memory device is improved.

Figure 20:
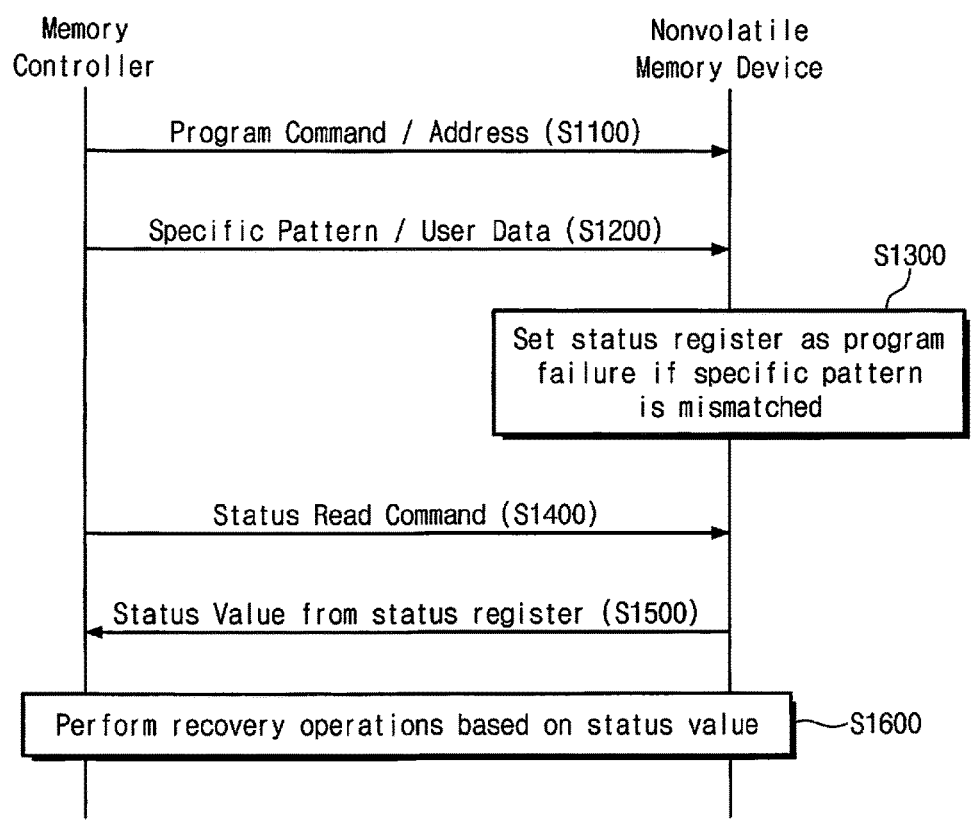
FIG. 20 is a view illustrating an operation between a memory controller and the nonvolatile memory device, according to the inventive concepts.

FIG. 20 is a view illustrating an operation between a memory controller and a nonvolatile memory device, according to the inventive concepts. To describe the technical idea of the inventive concepts clearly, an operation of the case where a specific pattern is mismatched with a particular (or, alternatively, predefined) pattern is described.

Referring to FIGS. 1 and 20, in operation S1100, the memory controller 110 transmits a command (e.g., a program command) and an address to the nonvolatile memory device 120.

In operation S1200, the memory controller 110 transmits the specific pattern and user data to the nonvolatile memory device 120. The memory controller 110 may transmit the specific pattern through the data signal DQ and a data strobe signal DQS synchronized with the data signal DQ in a pattern period. A rising edge or a falling edge of the data strobe signal DQS may be aligned with a left edge or a right edge of a window of the data signal DQ in the pattern period. The memory controller 110 may transmit the user data UD through the data signal DQ and the data strobe signal DQS in a data period. The specific pattern SP may be a pattern that is based on a value of the address.

In operation S1300, if the specific pattern is mismatched with the particular (or, alternatively, predefined) pattern (e.g., based on a determination that the specific pattern is mismatched with the particular (or, alternatively, predefined) pattern), the nonvolatile memory device 120 may set a status register with "program failure". In some example embodiments, in operation S1300, information set in the status register may include mismatch information about the specific pattern.

In operation S1400, the memory controller 110 may transmit a status read command to the nonvolatile memory device 120. In some example embodiments, the status read command may be transmitted in a state where the ready/busy signal from the nonvolatile memory device 120 is busy.

In operation S1500, the nonvolatile memory device 120 may transmit a value set in the status register to the memory controller 110 in response to the status read command. The value may be encompassed in "status information," where the status information may include information associated with a mismatch between the specific pattern and a particular (or, alternatively, predefined) pattern, such that operation 1500 may include the memory controller 110 receiving status information from the nonvolatile memory device 120. The status information may include information associated with program failure of a program operation associated with the user data UD.

In operation S1600, the memory controller 110 may perform a recovery operation with the nonvolatile memory device 120 based on the received status information. Restated, in some example embodiments, operation 1600 may include the memory controller 110 performing a recovery operation on the nonvolatile memory device 120 in response to the status information received at operation S1500. The recovery operation may include the memory controller 110 performing a re-training operation with the nonvolatile memory device 120.

Figure 21:
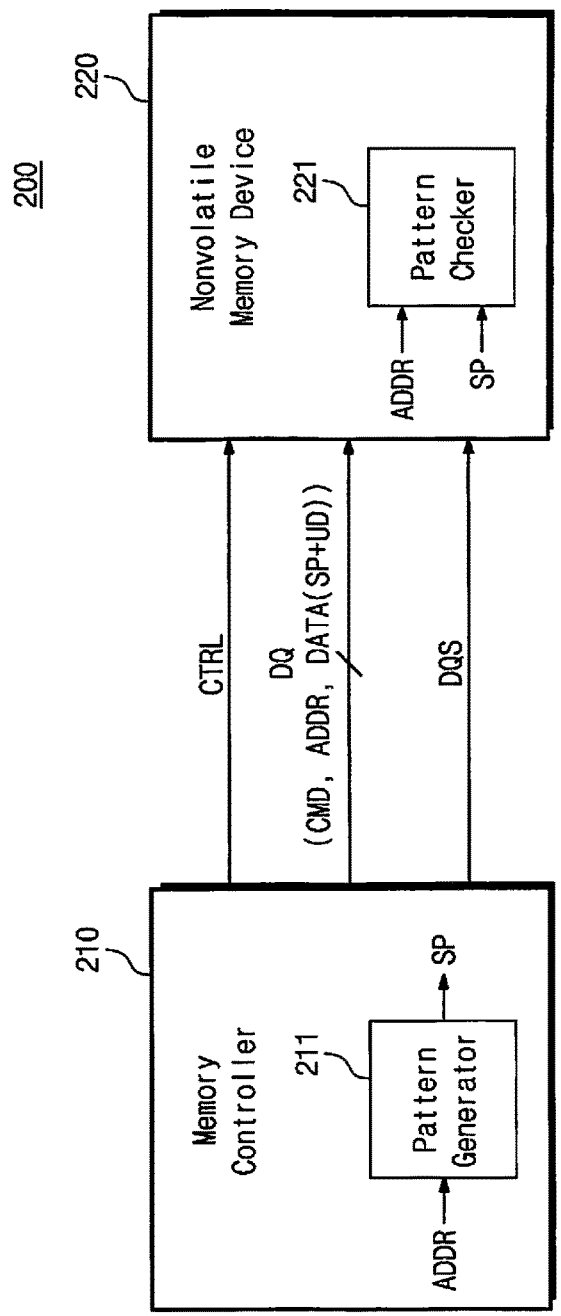
FIG. 21 is a block diagram illustrating a storage device according to some example embodiments of the inventive concepts.

FIG. 21 is a block diagram illustrating a storage device according to some example embodiments of the inventive concepts. Referring to FIG. 21, a storage device 200 may include a memory controller 210 and a nonvolatile memory device 220. The memory controller 210 may provide the control signal CTRL, the data signal DQ, and the data strobe signal DQS to the nonvolatile memory device 220. The memory controller 210 and the nonvolatile memory devices 220 are described with reference to FIG. 1, and a detailed description thereof will not be repeated here.

The memory controller 210 may include a pattern generator 211. The pattern generator 211 may generate the specific pattern SP to be provided to the nonvolatile memory device 220 during a pattern period. For example, the pattern generator 211 may generate the specific pattern SP based on an address ADDR to be provided to the nonvolatile memory device 220. In some example embodiments, the specific pattern SP may have the same value as the address ADDR. Alternatively, the specific pattern SP may have a value obtained by combining values of the address ADDR.

The nonvolatile memory device 220 may include a pattern checker 221. The pattern checker 221 may perform a pattern check operation on the specific pattern SP received from the memory controller 210. In this case, unlike the above description, the pattern checker 221 may determine whether the received specific pattern SP is correct, based on the address ADDR received from the memory controller 210. That is, in some example embodiments, including the example embodiments illustrated in FIG. 21, the specific pattern SP may be not a particular (or, alternatively, predefined) pattern but a value, which is based on an address ADDR changed every program operation. Although not illustrated in FIG. 21, the specific pattern SP may be the same value as a command, may be a value obtained by combining commands, or may be a value obtained by combining a command and an address.

In some example embodiments, the nonvolatile memory device 220 may perform a program operation or a recovery operation depending on the pattern check result, as described above.

Figure 22:
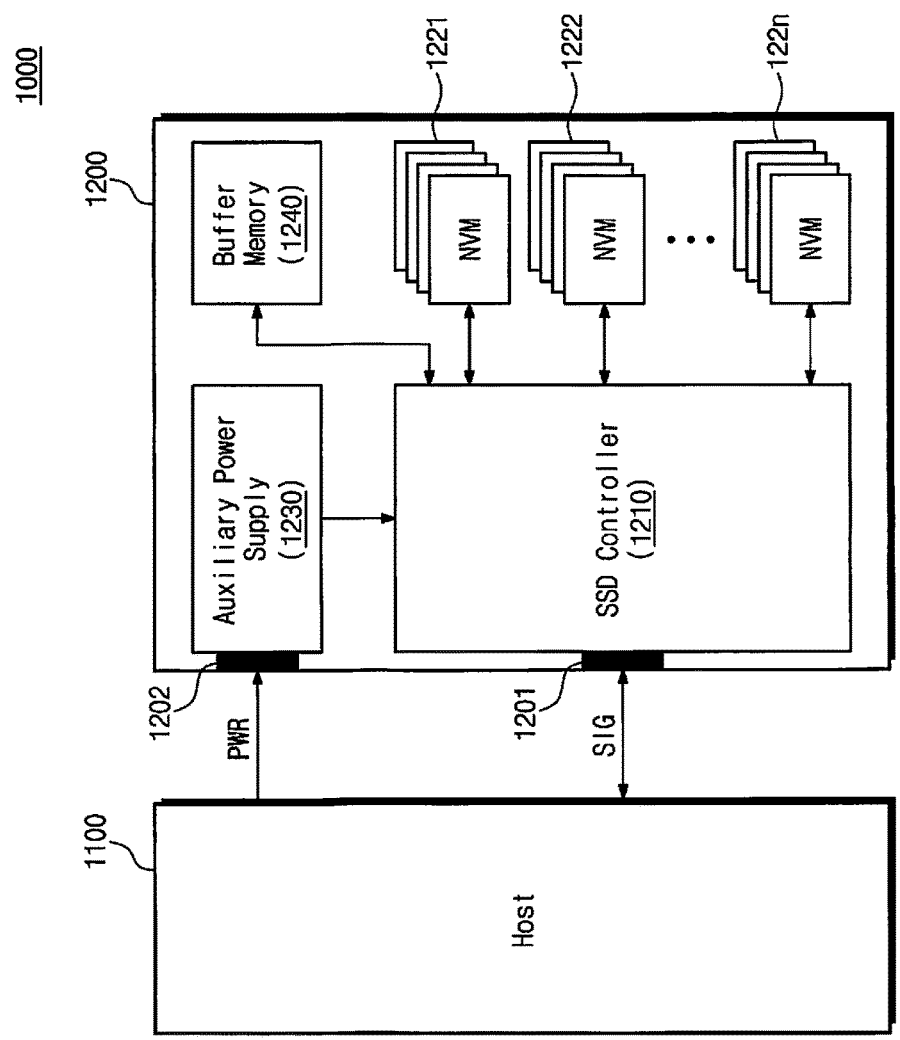
FIG. 22 is a block diagram illustrating a solid state drive system including the nonvolatile memory device according to the inventive concepts.

FIG. 22 is a block diagram illustrating a solid state drive (SSD) system 1000 including a nonvolatile memory device according to the inventive concepts. Referring to FIG. 22, the SSD system 1000 includes a host 1100 and an SSD 1200.

The SSD 1200 exchanges a signal SIG with the host 1100 through a signal connector 1201 and is supplied with power PWR through a power connector 1202. The SSD 1200 includes an SSD controller 1210, a plurality of flash memories 1221 to 122*n*, an auxiliary power supply 1230, and a buffer memory 1240. The SSD controller 1210 may include some or all of the elements and/or functionality described herein with regard to a memory controller. For example, the SSD controller 1210 may include a memory storing a program of instructions and a processor configured to execute the program of instructions to implement the functionality of the SSD controller 1210. The flash memories 1221 to 122*n* may partially or entirely include the elements and/or functionality of one or more of the nonvolatile memory devices as described herein.

The SSD controller 1210 may control the flash memories 1221 to 122*n* in response to the signal SIG from the host 1100. The flash memories 1221 to 122*n* may operate under the control of the SSD controller 1210. The auxiliary power supply 1230 is connected with the host 1100 through the power connector 1202. The auxiliary power supply 1230 may receive the power PWR from the host 1100 and may be charged by the power PWR. When the power PWR is not smoothly supplied from the host 1100, the auxiliary power supply 1230 may power the SSD system 1200. The buffer memory 1240 operates as a buffer memory of the SSD 1200.

In some example embodiments, as described with reference to FIGS. 1 to 21, during a program operation, each of the plurality of flash memories 1221 to 122*n* may receive a specific pattern from the SSD controller 1210, and may perform a program operation on user data or a recovery operation depending on a pattern check result of the received specific pattern.

According to the above-described embodiments of the invention examples, a nonvolatile memory device may receive a specific pattern in a pattern period and may perform a program operation on user data or a recovery operation, depending on whether the received specific pattern matches with a particular (or, alternatively, predefined) pattern. Accordingly, in the case where the data strobe signal DQS or the data signal DQ is distorted due to various factors, the distortion may be corrected, thereby improving the reliability, and thus the functionality, of the nonvolatile memory device.

According to some example embodiments, a nonvolatile memory device receives a specific pattern from a memory controller and performs a program operation on user data or a recovery operation depending on a pattern test result associated with the received specific pattern. Accordingly, since the reliability of user data is improved, a nonvolatile memory device with improved reliability and an operation method thereof, and thus improved functionality, are provided.

The various operations of methods described herein may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the inventive concepts has been described with reference to embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. An operation method of a nonvolatile memory device, the method comprising:
   receiving a program command and an address at the nonvolatile memory device from an external device through a data signal (DQ);
   receiving a specific pattern at the nonvolatile memory device from the external device through the data signal and a data strobe signal (DQS) synchronized with the data signal in a pattern period, wherein a rising edge or a falling edge of the data strobe signal is aligned with a left edge or a right edge of a window of the data signal in the pattern period;
   receiving user data at the nonvolatile memory device from the external device through the data signal and the data strobe signal in a data period; and
   selectively performing a program operation on the user data or a recovery operation at the nonvolatile memory device based on a determination of whether the specific pattern matches with a particular pattern.

2. The method of claim 1, wherein a length of the pattern period corresponds to a particular period of the data strobe signal.

3. The method of claim 1, further comprising:
   processing the program operation as program failure without the program operation on the user data at the nonvolatile memory device based on a determination that the specific pattern does not match with the particular pattern.

4. The method of claim 3, further comprising:
   providing information associated with the program failure from the nonvolatile memory device to the external device as status information based on a request of the external device.

5. The method of claim 4, further comprising:
   providing the status information from the nonvolatile memory device to the external device in response to a determination that a program confirm command is received at the nonvolatile memory device from the external device.

6. The method of claim 4, further comprising:
providing the status information from the nonvolatile memory device to the external device prior to a program confirm command being received at the nonvolatile memory device from the external device.

7. The method of claim 1, wherein the recovery operation includes a re-training operation performed at the nonvolatile memory device under control of the external device.

8. The method of claim 7, wherein the re-training operation includes at least one of a ZQ calibration operation, a duty cycle correction (DCC) training operation, a read training operation, or a write training operation.

9. The method of claim 7, wherein the data strobe signal is center-aligned with the data signal as a result of the re-training operation.

10. The method of claim 1, further comprising:
receiving dummy data at the nonvolatile memory device from the external device through the data signal and the data strobe signal in a dummy period prior to the pattern period.

11. An operation method of a nonvolatile memory device, the method comprising:
receiving a program command and an address at the nonvolatile memory device from an external device through a data signal (DQ);
receiving a specific pattern at the nonvolatile memory device from the external device through the data signal and a data strobe signal (DQS) synchronized with the data signal in a pattern period;
receiving user data and a cyclic redundancy check (CRC) code at the nonvolatile memory device from the external device through the data signal and the data strobe signal in a data period; and
selectively performing a program operation on the user data or a recovery operation at the nonvolatile memory device based on a determination of whether the specific pattern does not match with a particular pattern and an error is detected from the user data based on the CRC code.

12. The method of claim 11, further comprising:
processing the program operation as program failure without performing the program operation on the user data at the nonvolatile memory device based on a determination that the specific pattern does not match with the particular pattern or if the error is detected from the user data based on the CRC code.

13. The method of claim 12, further comprising:
providing information associated with the program failure from the nonvolatile memory device to the external device as status information.

14. The method of claim 11, further comprising:
receiving dummy data at the nonvolatile memory device from the external device through the data signal and the data strobe signal during a dummy period prior to the pattern period.

15. The method of claim 14, wherein a length of the pattern period and a length of the dummy period is defined based on a set feature operation.

16. An operation method of a memory controller to control a nonvolatile memory device, the method comprising:
transmitting a command and an address from the memory controller to the nonvolatile memory device through a data signal;
transmitting a specific pattern from the memory controller to the nonvolatile memory device through the data signal and a data strobe signal synchronized with the data signal in a pattern period, wherein a rising edge or a falling edge of the data strobe signal is aligned with a left edge or a right edge of a window of the data signal in the pattern period;
transmitting user data from the memory controller to the nonvolatile memory device through the data signal and the data strobe signal in a data period;
receiving status information at the memory controller from the nonvolatile memory device; and
performing a recovery operation on the nonvolatile memory device in response to the status information.

17. The method of claim 16, wherein the status information includes information associated with a mismatch between the specific pattern and a particular pattern.

18. The method of claim 16, wherein the status information includes information associated with program failure of a program operation associated with the user data.

19. The method of claim 16, wherein the specific pattern is a pattern that is based on a value of the address.

20. The method of claim 16, wherein the recovery operation includes a re-training operation with the nonvolatile memory device.

* * * * *